United States Patent
Kim et al.

(10) Patent No.: US 11,978,739 B2
(45) Date of Patent: May 7, 2024

(54) SEMICONDUCTOR DEVICES

(71) Applicant: Samsung Electronics Co., Ltd., Suwon-si (KR)

(72) Inventors: Ho-Jun Kim, Suwon-si (KR); Jaehyeoung Ma, Seongnam-si (KR); Geumjong Bae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 460 days.

(21) Appl. No.: 17/199,497

(22) Filed: Mar. 12, 2021

(65) Prior Publication Data

US 2021/0202527 A1 Jul. 1, 2021

Related U.S. Application Data

(63) Continuation of application No. 16/295,198, filed on Mar. 7, 2019, now Pat. No. 10,978,486.

(30) Foreign Application Priority Data

Jul. 27, 2018 (KR) ........................ 10-2018-0087911

(51) Int. Cl.
*H01L 27/118* (2006.01)
*H01L 29/423* (2006.01)

(52) U.S. Cl.
CPC .. *H01L 27/11807* (2013.01); *H01L 29/42392* (2013.01); *H01L 2027/11829* (2013.01)

(58) Field of Classification Search
CPC ........... H01L 29/42392; H01L 29/6656; H01L 27/11807
See application file for complete search history.

(56) References Cited

U.S. PATENT DOCUMENTS

| 8,698,253 | B2 | 4/2014 | Ema et al. |
| 8,753,941 | B1 | 6/2014 | Benaissa et al. |
| 8,912,069 | B2 | 12/2014 | Ema et al. |
| 9,219,002 | B2 | 12/2015 | Hu et al. |
| 9,397,179 | B1 | 7/2016 | Seo |
| 9,614,068 | B2 | 4/2017 | Seo |
| 9,871,140 | B1 * | 1/2018 | Balakrishnan .... H01L 29/42392 |

(Continued)

FOREIGN PATENT DOCUMENTS

| CN | 105679673 A | 6/2016 |
| CN | 107134453 A | 9/2017 |
| CN | 108091653 A | 5/2018 |

*Primary Examiner* — Peter M Albrecht
(74) *Attorney, Agent, or Firm* — Myers Bigel, P.A.

(57) ABSTRACT

Semiconductor devices and methods of forming the same are provided. Semiconductor devices may include first and second active patterns on a substrate. Each of the first and second active patterns may extend in a first direction. The first and second active patterns may be aligned along the first direction and may be separated by a first trench extending in a second direction. The first trench may define a first sidewall of the first active pattern. The semiconductor devices may also include a channel pattern including first and second semiconductor patterns stacked on the first active pattern, a dummy gate electrode on the channel pattern and extending in the second direction, and a gate spacer on one side of the dummy gate electrode, the one side of the dummy gate electrode being adjacent to the first trench. The gate spacer may cover a first sidewall of the first active pattern.

10 Claims, 30 Drawing Sheets

(56) References Cited

U.S. PATENT DOCUMENTS

| | | |
|---|---|---|
| 9,917,152 B1 | 3/2018 | Cheng et al. |
| 9,929,160 B1 | 3/2018 | Lee et al. |
| 10,204,902 B2 | 2/2019 | Lee |
| 10,205,023 B2 | 2/2019 | Chung et al. |
| 10,861,860 B2 | 12/2020 | Hong et al. |
| 2006/0240622 A1 | 10/2006 | Lee et al. |
| 2016/0005851 A1 | 1/2016 | Song et al. |
| 2016/0049511 A1 | 2/2016 | Kim et al. |
| 2016/0380075 A1 | 12/2016 | Chung et al. |
| 2017/0179284 A1 | 6/2017 | Kim et al. |
| 2017/0236900 A1 | 8/2017 | Chang et al. |
| 2017/0256609 A1 | 9/2017 | Bhuwalka et al. |
| 2018/0083007 A1 | 3/2018 | Lee et al. |

\* cited by examiner

US 11,978,739 B2

SEMICONDUCTOR DEVICES

CROSS-REFERENCE TO RELATED APPLICATION

This application is a continuation of U.S. patent application Ser. No. 16/295,198, filed Mar. 7, 2019, which claims priority under 35 U.S.C § 119 to Korean Patent Application No. 10-2018-0087911 filed on Jul. 27, 2018 in the Korean Intellectual Property Office, the disclosure of which is hereby incorporated by reference in its entirety.

BACKGROUND

The present inventive concepts relate to a semiconductor device, and more particularly, to a semiconductor device including a field effect transistor and a method of manufacturing the same.

Semiconductor devices are beneficial in electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices and related technologies have been researched for high integration with the advanced development of electronic industry. Further, semiconductor devices and related technologies have been researched for high reliability, high speed, and/or multi-functionality.

SUMMARY

Some example embodiments of the present inventive concepts provide semiconductor devices with increased integrated and reliability.

According to some example embodiments of the present inventive concepts, semiconductor devices may include a first active pattern and a second active pattern on a substrate. Each of the first active pattern and the second active pattern may extend in a first direction. The first active pattern and the second active pattern may be aligned along the first direction and may be separated by a first trench that extends in a second direction intersecting the first direction. The first trench may define a first sidewall of the first active pattern. The semiconductor devices may also include a channel pattern including a first semiconductor pattern and a second semiconductor pattern that are sequentially stacked on the first active pattern, a dummy gate electrode running across the channel pattern and extending in the second direction, and a gate spacer on one side of the dummy gate electrode, the one side of the dummy gate electrode being adjacent to the first trench. The gate spacer may cover a first sidewall of the first active pattern.

According to some example embodiments of the present inventive concepts, semiconductor devices may include a first logic cell including a first active pattern and a second logic cell including a second active pattern on a substrate. The first logic cell and the second logic cell may be separated by a trench. The semiconductor devices may also include a first channel pattern and a second channel pattern on the first and second active patterns, respectively. Each of the first channel pattern and the second channel pattern may include a plurality of semiconductor patterns. The semiconductor devices may further include a dummy gate electrode adjacent to the trench and a gate spacer on one side of the dummy gate electrode. The first active pattern may include a first sidewall defined by the trench, the second active pattern may include a second sidewall defined by the trench, and the gate spacer may cover at least one of the first and second sidewalls.

According to some example embodiments of the present inventive concepts, semiconductor devices may include a first active pattern and a second active pattern on a substrate. Each of the first active pattern and the second active pattern may extend in a first direction. The first active pattern and the second active pattern may be aligned along the first direction and may be separated by a first trench that extends in a second direction intersecting the first direction. The semiconductor devices may also include a channel pattern including a first semiconductor pattern and a second semiconductor pattern that are sequentially stacked on the first active pattern. The first active pattern may include a first sidewall defined by the first trench, the channel pattern may include a second sidewall defined by the first trench, and the first sidewall and the second sidewall may be vertically aligned with each other. A length of the first semiconductor pattern in the first direction may be different from a length of the second semiconductor pattern in the first direction.

DETAILED DESCRIPTION

Figure 1:
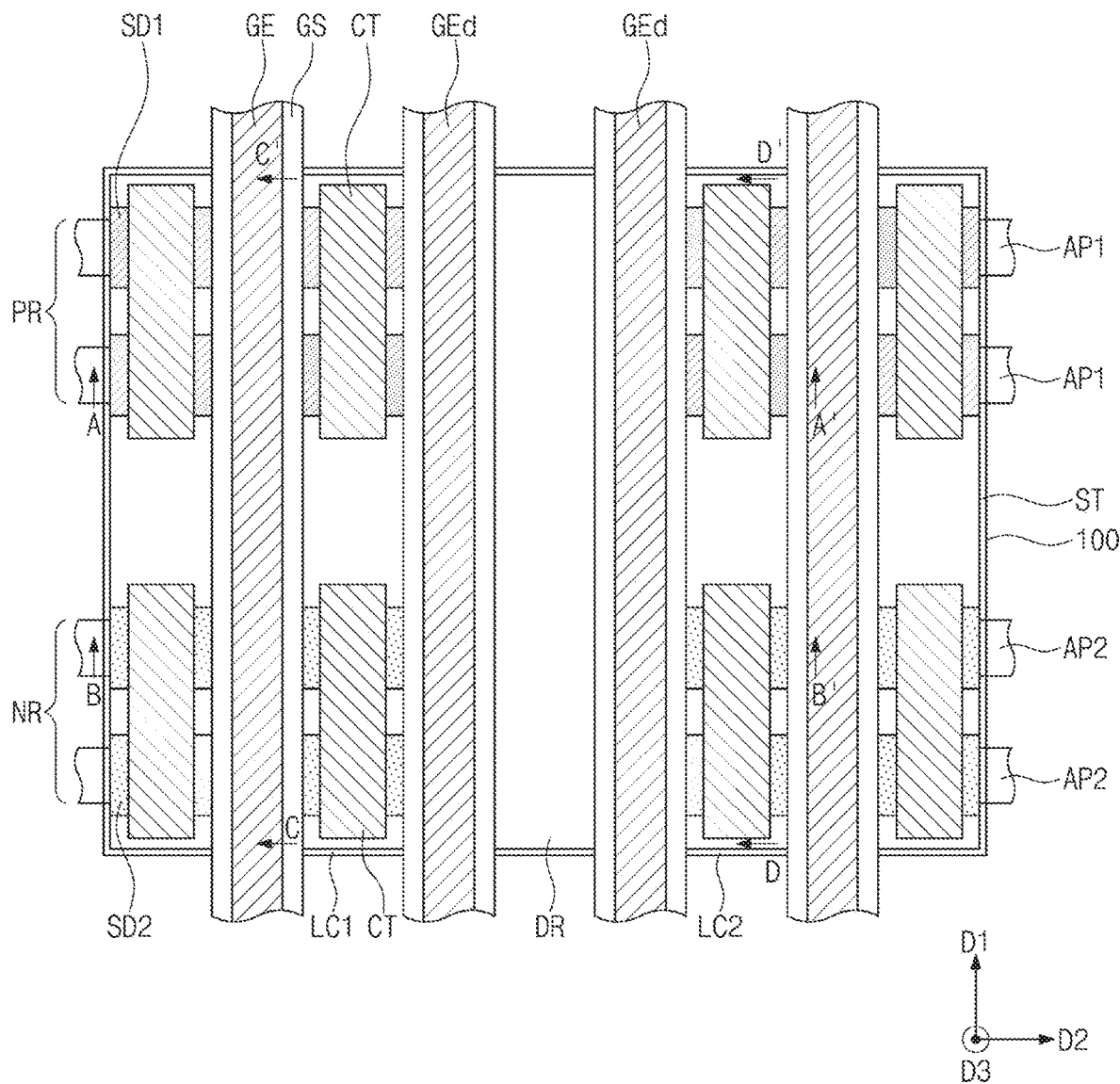
FIG. 1 illustrates a plan view showing a semiconductor device according to some example embodiments of the present inventive concepts.

FIG. 1 illustrates a plan view showing a semiconductor device according to some example embodiments of the present inventive concepts. FIGS. 2A, 2B, 2C, and 2D illustrate cross-sectional views respectively taken along lines A-A', B-B', C-C', and D-D' of FIG. 1.

Referring to FIGS. 1 and 2A to 2D, a first logic cell LC1 and a second logic cell LC2 may be provided on a logic region of a substrate 100. The first and second logic cells LC1 and LC2 may be arranged in a second direction D2. Each of the first and second logic cells LC1 and LC2 may constitute a logic circuit. For example, each of the first and logic cells LC1 and LC2 may be provided thereon with logic transistors that constitute the logic circuit. In certain embodiments, the first and second logic cells LC1 and LC2 may include the same or different logic circuits.

The substrate 100 may include a PMOSFET region PR and an NMOSFET region NR. The substrate 100 may be a semiconductor substrate. For example, the substrate 100 may be a silicon substrate, a germanium substrate, or a silicon-on-insulator (SOI) substrate. First transistors may be provided on the PMOSFET region PR of the substrate 100, and second transistors may be provided on the NMOSFET region NR of the substrate 100. The first and second transistors may be ones of the logic transistors.

The first transistors on the PMOSFET region PR may have a different conductivity type from that of the second transistors on the NMOSFET region NR. For example, the first transistors on the PMOSFET region PR may be PMOSFETs, and the second transistors on the NMOSFET region NR may be NMOSFETs.

A device isolation layer ST may be provided on the substrate 100. The device isolation layer ST may define first and second active patterns AP1 and AP2 on an upper portion of the substrate 100. The first active patterns AP1 may be disposed on the PMOSFET region PR. The second active patterns AP2 may be disposed on the NMOSFET region NR. Each of the first and second active patterns AP1 and AP2 may have a linear or bar shape extending in the second direction D2.

The device isolation layer ST may fill a first trench TR1 between a pair of neighboring first active patterns AP1. The device isolation layer ST may fill a first trench TR1 between a pair of neighboring second active patterns AP2. The device isolation layer ST may have a top surface lower than those of the first and second active patterns AP1 and AP2. It will be understood that "an element A fills an element B" (or similar language) means that the element A is in the element B but does not necessarily mean that the element A completely fills the element B.

First channel patterns CH1 and first source/drain patterns SD1 may be provided on each of the first active patterns AP1. Each of the first channel patterns CH1 may be interposed between a pair of neighboring first source/drain patterns SD1. Second channel patterns CH2 and second source/drain patterns SD2 may be provided on each of the second active patterns AP2. Each of the second channel patterns CH2 may be interposed between a pair of neighboring second source/drain patterns SD2.

Each of the first channel patterns CH1 may include first, second, and third semiconductor patterns SP1, SP2, and SP3 that are sequentially stacked. The first, second, and third semiconductor patterns SP1, SP2, and SP3 may be spaced apart from each other in a third direction D3 perpendicular to a top surface of the substrate 100. The first, second, and third semiconductor patterns SP1, SP2, and SP3 may vertically overlap each other. Each of the first source/drain patterns SD1 may directly contact a sidewall of each of the first, second, and third semiconductor patterns SP1, SP2, and SP3. For example, the first, second, and third semiconductor patterns SP1, SP2, and SP3 may connect a pair of neighboring first source/drain patterns SD1 to each other.

The first, second, and third semiconductor patterns SP1, SP2, and SP3 of the first channel pattern CH1 may have the same or different thicknesses (e.g., thicknesses in the third direction D3). The first, second, and third semiconductor patterns SP1, SP2, and SP3 of the first channel pattern CH1 may have different maximum lengths in the second direction D2. For example, a first length L1 may refer to the maximum length in the second direction D2 of the second semiconductor pattern SP2. Each of the first and third semiconductor patterns SP1 and SP3 may have a length in the second direction D2, which length may be greater than the first length L1 of the second semiconductor pattern SP2. For example, a second length L2 may refer to the maximum length in the second direction D2 of the first semiconductor pattern SP1. The second length L2 may be greater than the first length L1.

The first, second, and third semiconductor patterns SP1, SP2, and SP3 may include one or more of silicon (Si), germanium (Ge), and silicon-germanium (SiGe). The first channel pattern CH1 is illustrated to include the first, second, and third semiconductor patterns SP1, SP2, and SP3, but the number of semiconductor patterns is not particularly limited. In some embodiments, the first channel pattern CH1 may include more than three semiconductor patterns.

Each of the second channel patterns CH2 may include first, second, and third semiconductor patterns SP1, SP2, and SP3 that are sequentially stacked. The first, second, and third semiconductor patterns SP1, SP2, and SP3 of the second channel pattern CH2 may have substantially the same length in the second direction D2. A detailed description of the first, second, and third semiconductor patterns SP1, SP2, and SP3 included in the second channel pattern CH2 may be substantially identical or similar to that of the first, second, and third semiconductor patterns SP1, SP2, and SP3 included in the first channel pattern CH1 discussed above.

The first, second, and third semiconductor patterns SP1, SP2, and SP3 of the first channel pattern CH1 and a first recess RS1 of the first active pattern AP1 may serve as a seed layer from which each of the first source/drain patterns SD1 is grown as an epitaxial pattern. The first source/drain patterns SD1 may be p-type impurity regions. The first source/drain patterns SD1 may include a material that provides the first channel pattern CH1 with compressive stress. For example, the first source/drain patterns SD1 may include a semiconductor element (e.g., SiGe) whose lattice constant is greater than that of a semiconductor element of the substrate 100.

The first, second, and third semiconductor patterns SP1, SP2, and SP3 of the second channel pattern CH2 and a second recess RS2 of the second active pattern AP2 may serve as a seed layer from which each of the second source/drain patterns SD2 is grown as an epitaxial pattern. The second source/drain patterns SD2 may be n-type impurity regions. For example, the second source/drain patterns SD2 may include the same semiconductor element (e.g. Si) as that of the substrate 100.

A semiconductor element contained in the first source/drain pattern SD1 may be different from a semiconductor element contained in the second source/drain pattern SD2. A cross-sectional shape in a first direction D1 of the first source/drain pattern SD1 may be different from a cross-sectional shape in the first direction D1 of the second source/drain pattern SD2 (see FIG. 2D).

Gate electrodes GE may be provided to extend in the first direction D1, while running across the first and second active patterns AP1 and AP2. The gate electrodes GE may be spaced apart from each other in the second direction D2. The gate electrodes GE may vertically overlap the first and second channel patterns CH1 and CH2, respectively. For example, the gate electrode GE may include one or more of conductive metal nitride (e.g., titanium nitride or tantalum nitride) and metal (e.g., titanium, tantalum, tungsten, copper, or aluminum). In some embodiments, each of the gate electrodes GE may extend longitudinally in the first direction D1 as illustrated in FIG. 1.

The gate electrode GE may surround each of the first, second, and third semiconductor patterns SP1, SP2, and SP3 of the first channel pattern CH1. For example, the gate electrode GE may surround top and bottom surfaces and opposite sidewalls of each of the first, second, and third semiconductor patterns SP1, SP2, and SP3 (see FIG. 2C). The gate electrode GE may surround each of the first, second, and third semiconductor patterns SP1, SP2, and SP3 of the second channel pattern CH2. In this sense, the first and second transistors according to some example embodiments of the present inventive concepts may be gate-all-around type field effect transistors. It will be understood that "an element A surrounds an element B" (or similar language) means that the element A is on the element B (e.g., a side of the element B) but does not necessarily mean that the element A completely surrounds/encloses the element B.

A pair of gate spacers GS may be disposed on opposite sidewalls of each of the gate electrodes GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. The gate spacers GS may include one or more of SiCN, SiCON, and SiN. In some embodiments, the gate spacers GS may include multiple layers consisting of two or more of SiCN, SiCON, and SiN.

A gate dielectric pattern GI may be interposed between each of the gate electrodes GE and each of the first and second channel patterns CH1 and CH2. The gate dielectric pattern GI may surround each of the first, second, and third semiconductor patterns SP1, SP2, and SP3. The gate dielectric pattern GI may be interposed between the gate electrode GE and each of the first, second, and third semiconductor patterns SP1, SP2, and SP3. The gate dielectric pattern GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern CP may be provided on each of the gate electrodes GE. The gate capping pattern CP may extend in the first direction D1 along the gate electrode GE. The gate capping pattern CP may include a material having an etch selectivity with respect to a first interlayer dielectric layer 110 which will be discussed below. For example, the gate capping patterns CP may include one or more of SiON, SiCN, SiCON, and SiN.

The substrate 100 may include a division region DR at a cell boundary between the first and second logic cells LC1 and LC2. The division region DR may be provided thereon with a second trench TR2 extending in the first direction D1. The second trench TR2 may separate the first and second logic cells LC1 and LC2 from each other. The first and second logic cells LC1 and LC2 may be spaced apart in the second direction D2 from each other across the second trench TR2. The device isolation layer ST may fill the second trench TR2 as well as the first trench TR1 discussed above.

For example, the second trench TR2 may separate one first active pattern AP1 into a pair of the first active patterns AP1 adjacent to each other in the second direction D2. The second trench TR2 may define a first sidewall SW1 and a second sidewall SW2 that are provided on each of the pair of the first active patterns AP1. The first and second sidewalls SW1 and SW2 may face each other in the second direction D2 across the second trench TR2. The device isolation layer ST filling the second trench TR2 may directly cover a lower portion of each of the first and second sidewalls SW1 and SW2. It will be understood that "an element A covers a surface of an element B" (or similar language) means that the element A is on the surface of the element B but does not necessarily mean that the element A covers the surface of the element B entirely.

Figure 2A:
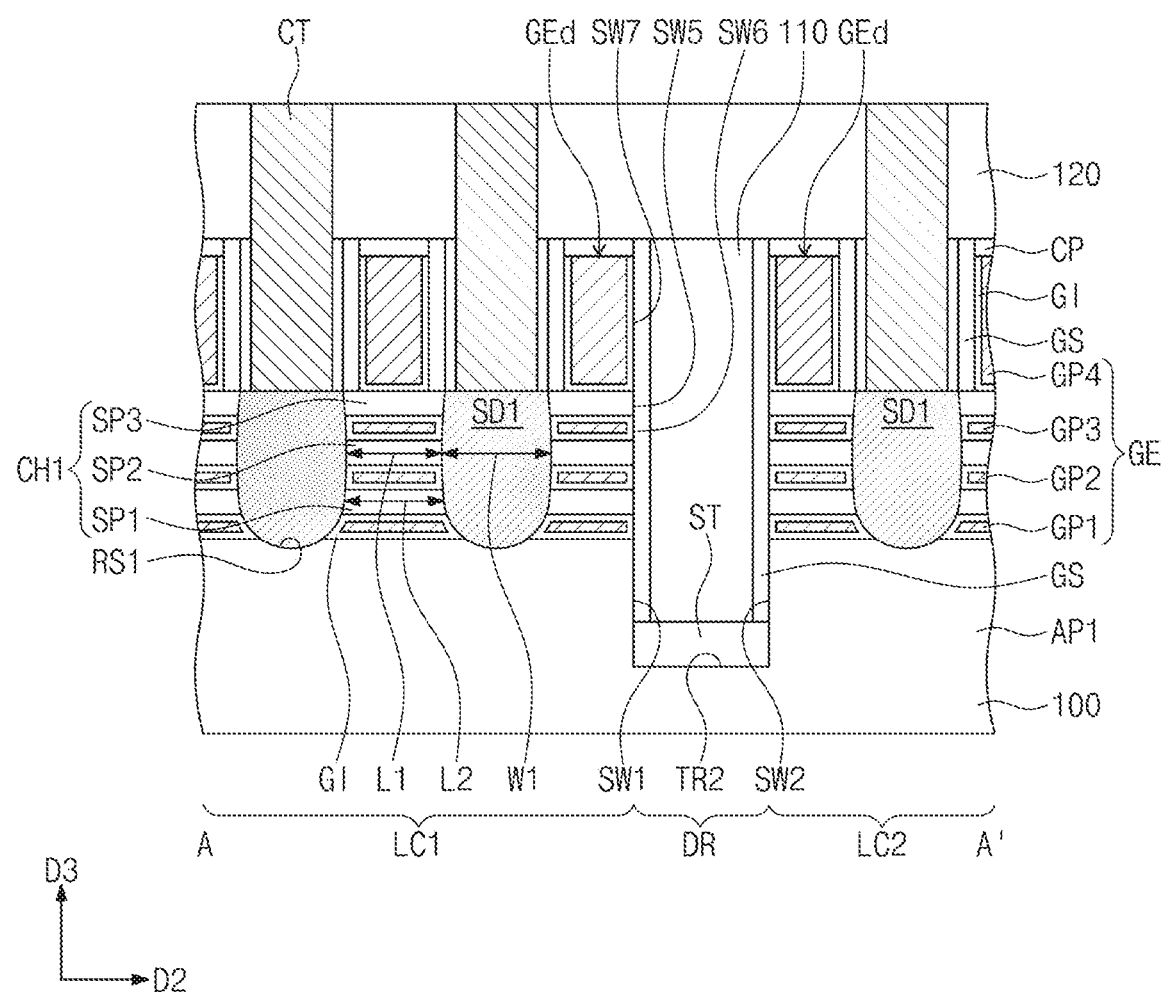
FIGS. 2A, 2B, 2C, and 2D illustrate cross-sectional views respectively taken along lines A-A', B-B', C-C', and D-D' of FIG. 1.

In some embodiments, the second trench TR2 may be between a pair of the first active patterns AP1 that are directly adjacent to each other as illustrated in FIGS. 1 and 2A. The pair of the first active patterns AP1 may extend longitudinally in the second direction D2, may be aligned along the second direction D2, and may be separated by the second trench TR2 between the pair of the first active patterns AP1 as illustrated in FIGS. 1 and 2A. It will be understood that the term "directly adjacent to" as used herein describes configurations where two "elements" (such as a pair of the first active patterns AP1) which are said to be directly adjacent to each other are positioned so that no other like element (such as a first active patterns AP1) is located between the two elements which are said to be directly adjacent to each other. In some embodiments, the device isolation layer ST may directly contact the lower portion of each of the first and second sidewalls SW1 and SW2 as illustrated in FIG. 2A.

The second trench TR2 may separate one second active pattern AP2 into a pair of the second active patterns AP2 adjacent to each other in the second direction D2. The second trench TR2 may define a third sidewall SW3 and a fourth sidewall SW4 that are provided on each of the pair of the second active patterns AP2. The third and fourth sidewalls SW3 and SW4 may face each other in the second direction D2 across the second trench TR2. The device isolation layer ST filling the second trench TR2 may directly cover a lower portion of each of the third and fourth sidewalls SW3 and SW4.

Figure 2B:
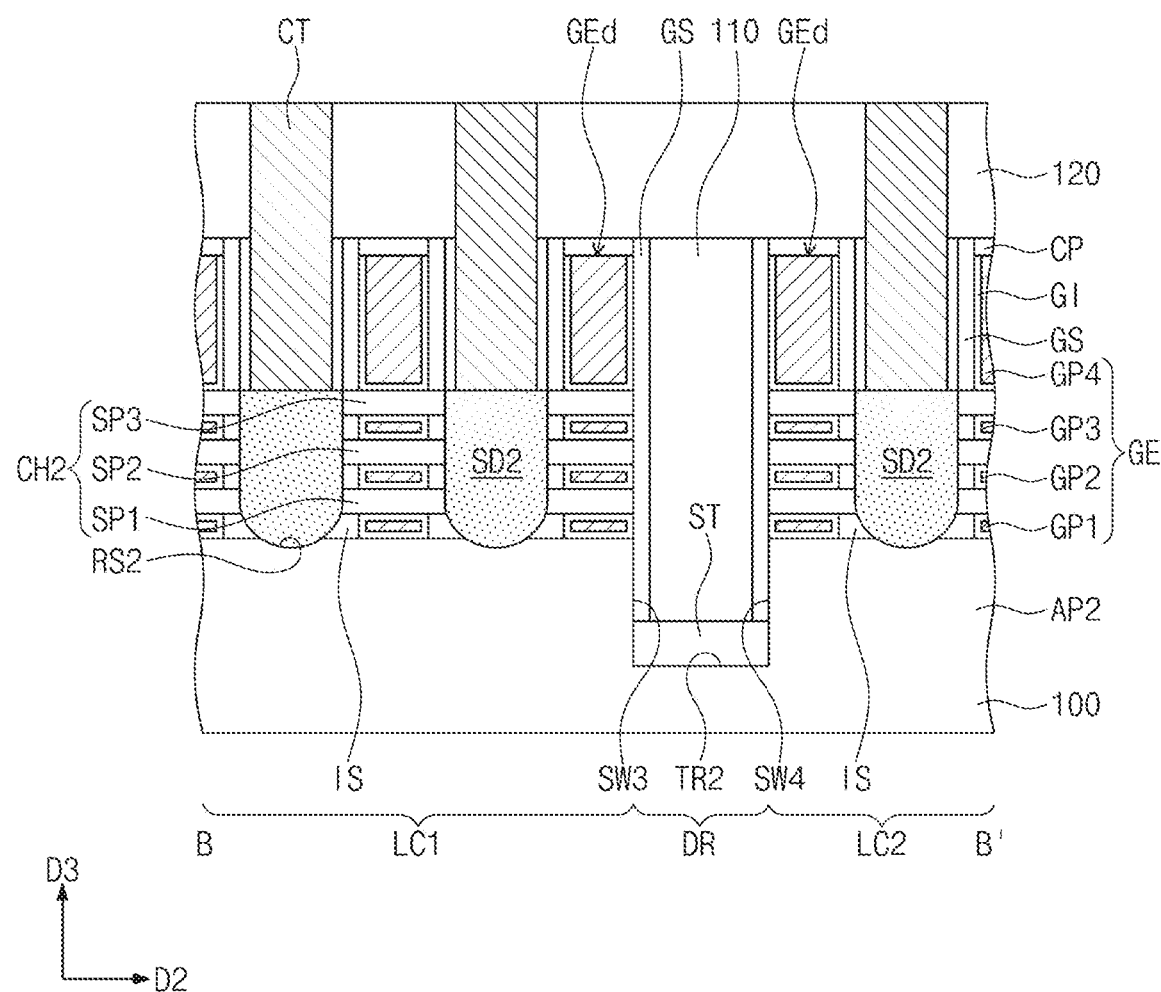
Figure 2C:
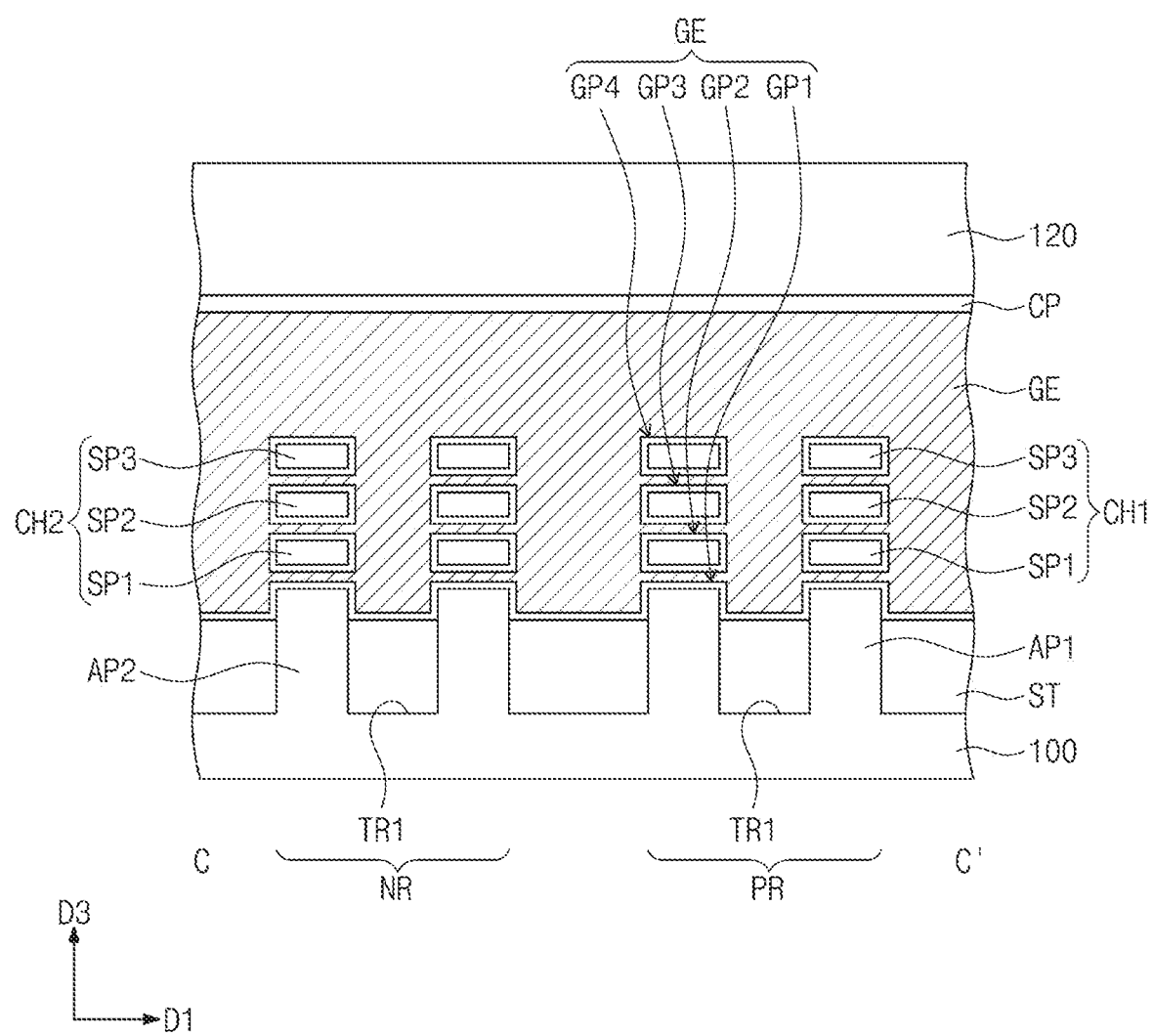
Figure 2D:
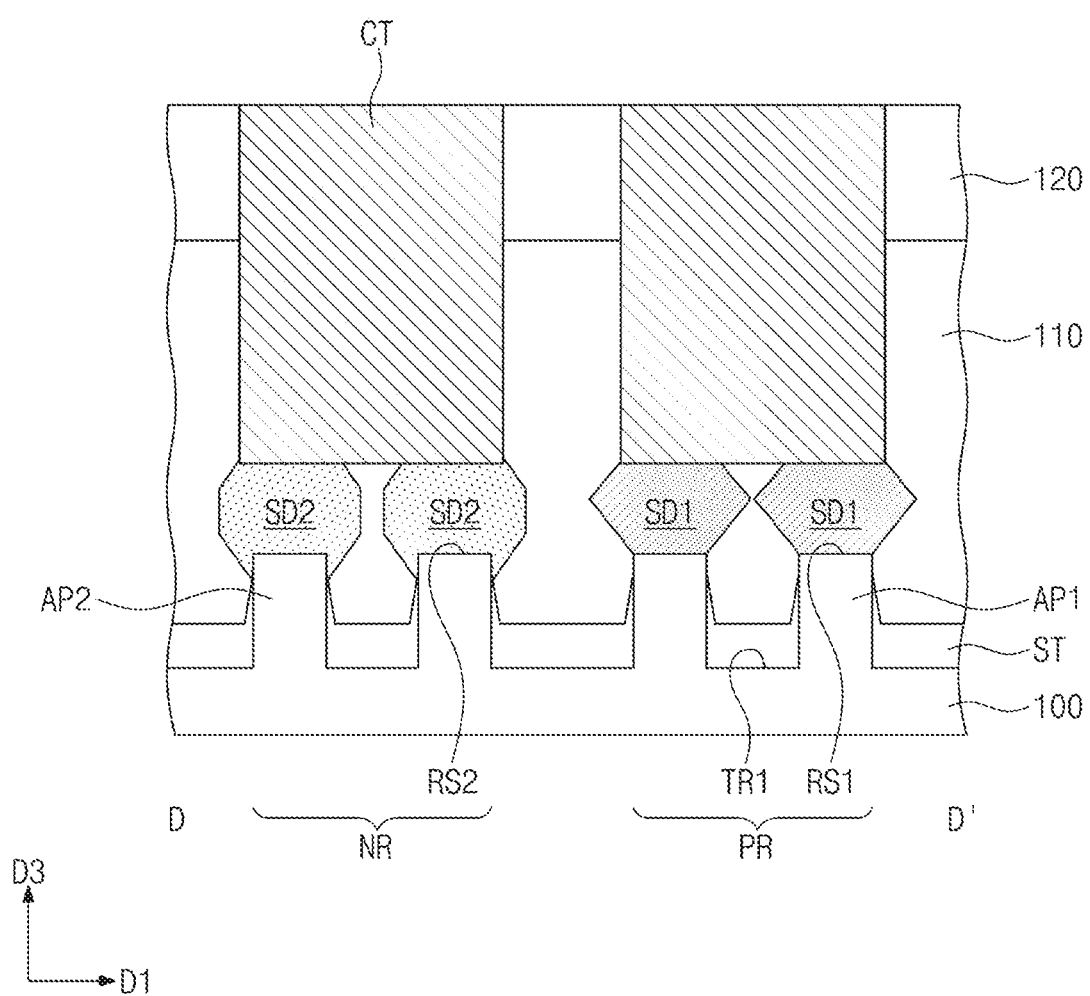

In some embodiments, the second trench TR2 may be between a pair of the second active pattern AP2 that are directly adjacent to each other as illustrated in FIGS. 1 and 2A. The pair of the second active pattern AP2 may extend longitudinally in the second direction D2, may be aligned along the second direction D2, and may be separated by the second trench TR2 between the pair of the second active pattern AP2 as illustrated in FIGS. 1 and 2A. In some embodiments, the device isolation layer ST may directly contact the lower portion of each of the third and fourth sidewalls SW3 and SW4 as illustrated in FIG. 2B.

A first interlayer dielectric layer 110 may be provided on an entire surface of the substrate 100. The first interlayer dielectric layer 110 may cover the device isolation layer ST, the gate spacers GS, and the first and second source/drain patterns SD1 and SD2. The first interlayer dielectric layer 110 may have a top surface substantially coplanar with those of the gate capping patterns CP. A second interlayer dielectric layer 120 may be provided on the first interlayer dielectric layer 110. For example, the first and second interlayer dielectric layers 110 and 120 may include a silicon oxide layer or a silicon oxynitride layer.

Contacts CT may be provided to penetrate the first and second interlayer dielectric layers 110 and 120 and to have connection with the first and second source/drain patterns SD1 and SD2. For example, the contacts CT may include a metallic material, such as titanium, tantalum, tungsten, copper, or aluminum.

The first transistor on the PMOSFET region PR will be further discussed in detail with reference back to FIG. 2A. The gate electrode GE on the PMOSFET region PR may include first to fourth segments GP1 to GP4. The first segment GP1 may be interposed between the first active pattern AP1 and the first semiconductor pattern SP1, the second segment GP2 may be interposed between the first semiconductor pattern SP1 and the second semiconductor pattern SP2, the third segment GP3 may be interposed between the second semiconductor pattern SP2 and the third semiconductor pattern SP3, and the fourth segment GP4 may be provided on the third semiconductor pattern SP3.

Each of the first source/drain patterns SD1 may fill the first recess RS1 formed on an upper portion of the first active pattern AP1. The first recess RS1 may be defined between the first channel patterns CH1 adjacent to each other. The first recess RS1 may have a floor lower than the top surface of the first active pattern AP1.

A first width W1 may refer to a maximum width in the second direction D2 of each of the first source/drain patterns SD1. A middle portion of the first source/drain pattern SD1 may have the first width W1. The middle portion of the first source/drain pattern SD1 may be located at substantially the same level as that of the second semiconductor pattern SP2. A width in the second direction D2 of the first source/drain pattern SD1 may increase as approaching the middle portion from an upper portion of the first source/drain pattern SD1. The width in the second direction D2 of the first source/drain pattern SD1 may decrease as approaching a lower portion of the first source/drain pattern SD1 from the middle portion.

The gate dielectric pattern GI may be interposed between the first source/drain pattern SD1 and each of the first to third segments GP1 to GP3. The gate dielectric patterns GI may directly contact the first source/drain pattern SD1.

The second transistor on the NMOSFET region NR will be further discussed in detail with reference back to FIG. 2B. The gate electrode GE on the NMOSFET region NR may include first to fourth segments GP1 to GP4. The first segment GP1 may be interposed between the second active pattern AP2 and the first semiconductor pattern SP1, the second segment GP2 may be interposed between the first semiconductor pattern SP1 and the second semiconductor pattern SP2, the third segment GP3 may be interposed between the second semiconductor pattern SP2 and the third semiconductor pattern SP3, and the fourth segment GP4 may be provided on the third semiconductor pattern SP3.

An inner spacer IS may be interposed between the second source/drain pattern SD2 and each of the first to third segments GP1 to GP3. Each of the inner spacers IS may separate the gate dielectric pattern GI from the second source/drain pattern SD2. Each of the first to third segments GP1 to GP3 may be spaced apart from the second source/drain pattern SD2 across the inner spacer IS. For example, the inner spacers IS may include a silicon nitride layer.

Referring back to FIGS. 1 and 2A to 2D, the gate electrodes GE may include dummy gate electrodes GEd. The dummy gate electrodes GEd may be disposed adjacent to the division region DR. The division region DR may be interposed between a pair of the dummy gate electrodes GEd. The gate spacer GS on the division region DR may downwardly extend from a sidewall of the gate capping pattern CP toward the device isolation layer ST filing the second trench TR2.

The gate spacer GS on the division region DR may cover a sidewall of each of the first, second, and third semiconductor patterns SP1, SP2, and SP3 that are adjacent to the division region DR. For example, the gate spacer GS on the division region DR may cover a sidewall of each of the first and second channel patterns CH1 and CH2 that are adjacent to the division region DR. The first channel CH1 adjacent to the division region DR may have a fifth sidewall SW5. The gate spacer GS on the division region DR may cover the fifth sidewall SW5.

The gate spacer GS on the division region DR may cover the gate dielectric pattern GI on a sidewall of each of the first to fourth segments GP1 to GP4 of the dummy gate electrode GEd. For example, the gate dielectric pattern GI covering the third segment GP3 of the dummy gate electrode GEd may have a sixth sidewall SW6. The gate dielectric pattern GI covering the fourth segment GP4 of the dummy gate electrode GEd may have a seventh sidewall SW7. The gate spacer GS on the division region DR may cover the sixth and seventh sidewalls SW6 and SW7.

The gate spacer GS on the division region DR may cover its adjacent upper sidewall of one of the first to fourth sidewalls SW1 to SW4 of the first and second active patterns AP1 and AP2. For example, the first, fifth, sixth, and seventh sidewalls SW1, SW5, SW6, and SW7 may be vertically aligned with each other. The gate spacer GS may cover the first, fifth, sixth, and seventh sidewalls SW1, SW5, SW6, and SW7 that are vertically aligned with each other. In some embodiments, the first, fifth, sixth, and seventh sidewalls SW1, SW5, SW6, and SW7 may be coplanar with each other as illustrated in FIG. 2A and form a straight side.

A semiconductor device according to some example embodiments of the present inventive concepts may be configured such that the gate spacer GS on the division region DR may cover a sidewall (e.g., SW5) of one of the channel patterns CH1 and CH2 and a sidewall (e.g., SW1) of one of the active patterns AP1 and AP2. Accordingly, it may be possible to reduce or prevent degradation of one of the first and second source/drain patterns SD1 and SD2 adjacent to the division region DR, which may result in improvement of reliability and electrical characteristics of the semiconductor device.

Figure 10A:
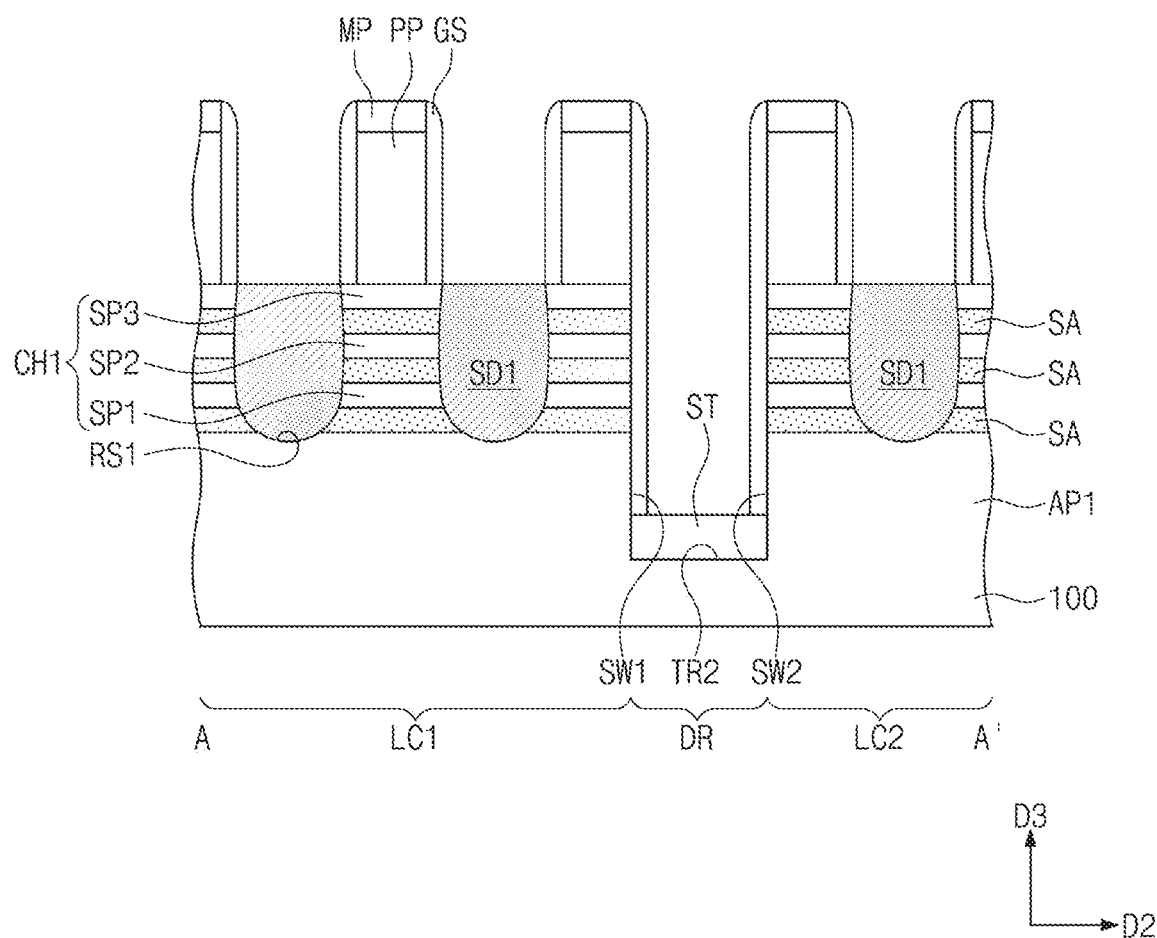
Figure 10B:
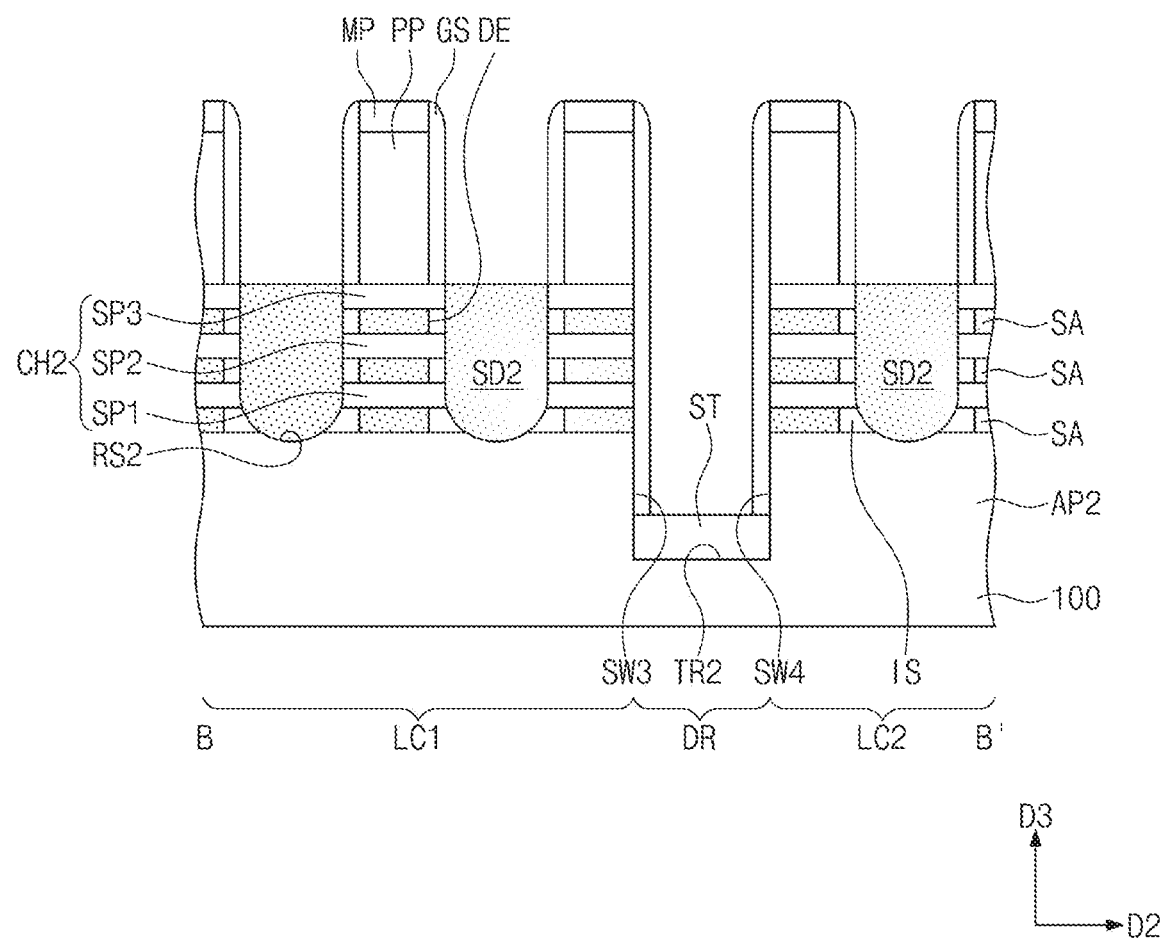
Figure 10C:
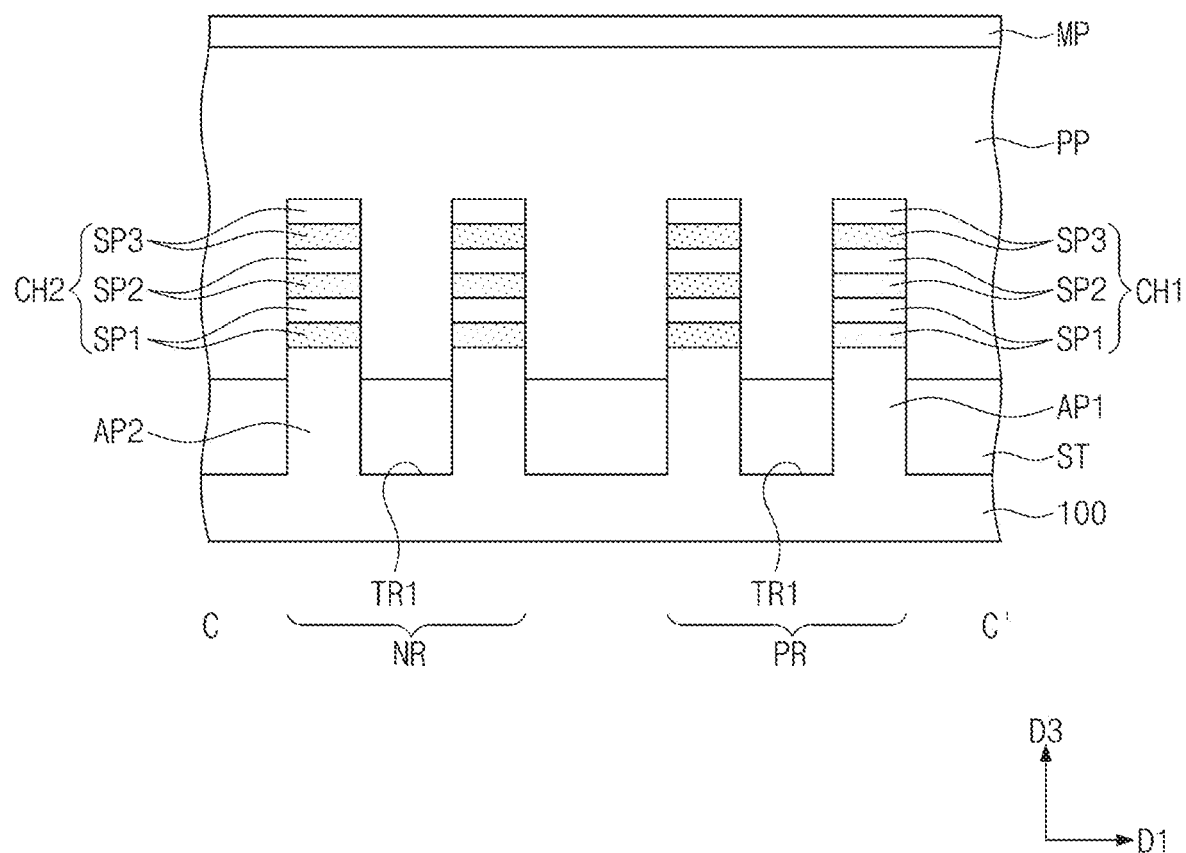
FIGS. 10C and 12C illustrate cross-sectional views taken along line C-C' of FIGS. 9 and 11, respectively.
Figure 10D:
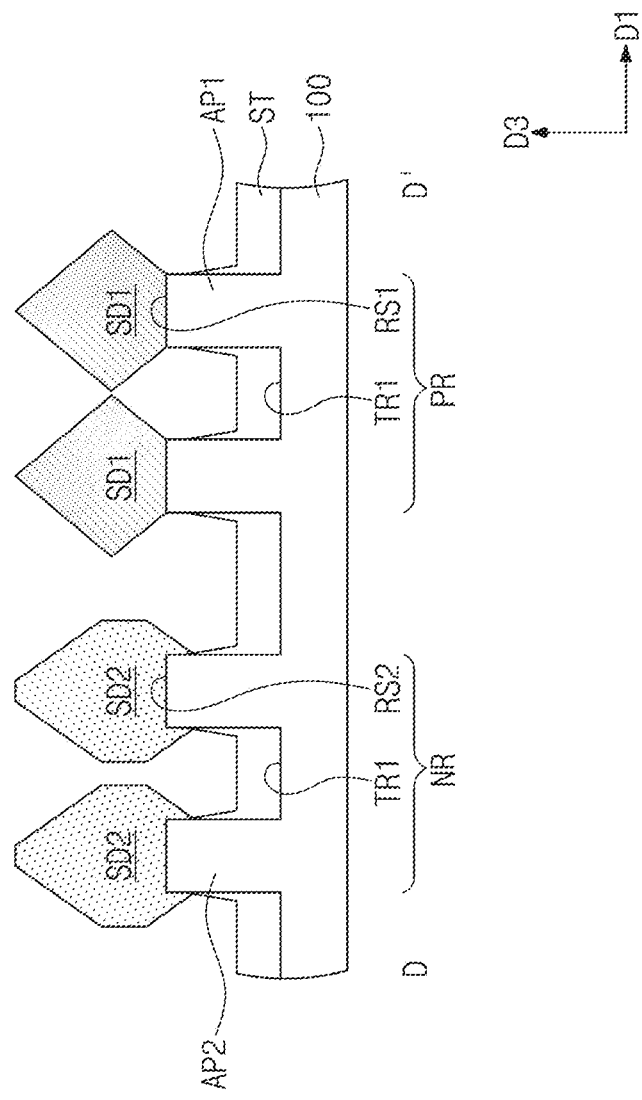
FIGS. 10D and 12D illustrate cross-sectional views taken along line D-D' of FIGS. 9 and 11, respectively.
Figure 11:
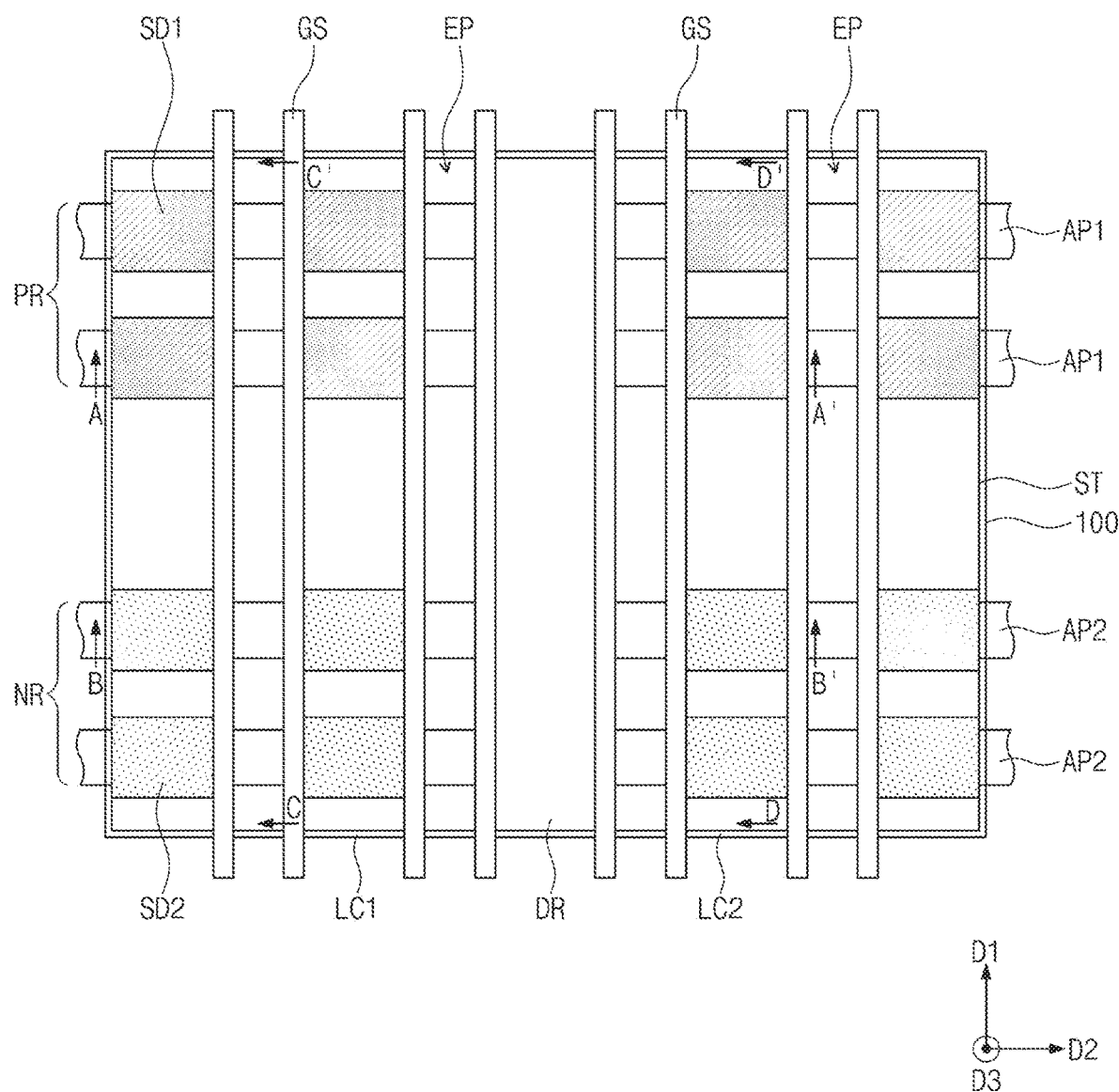
Figure 12A:
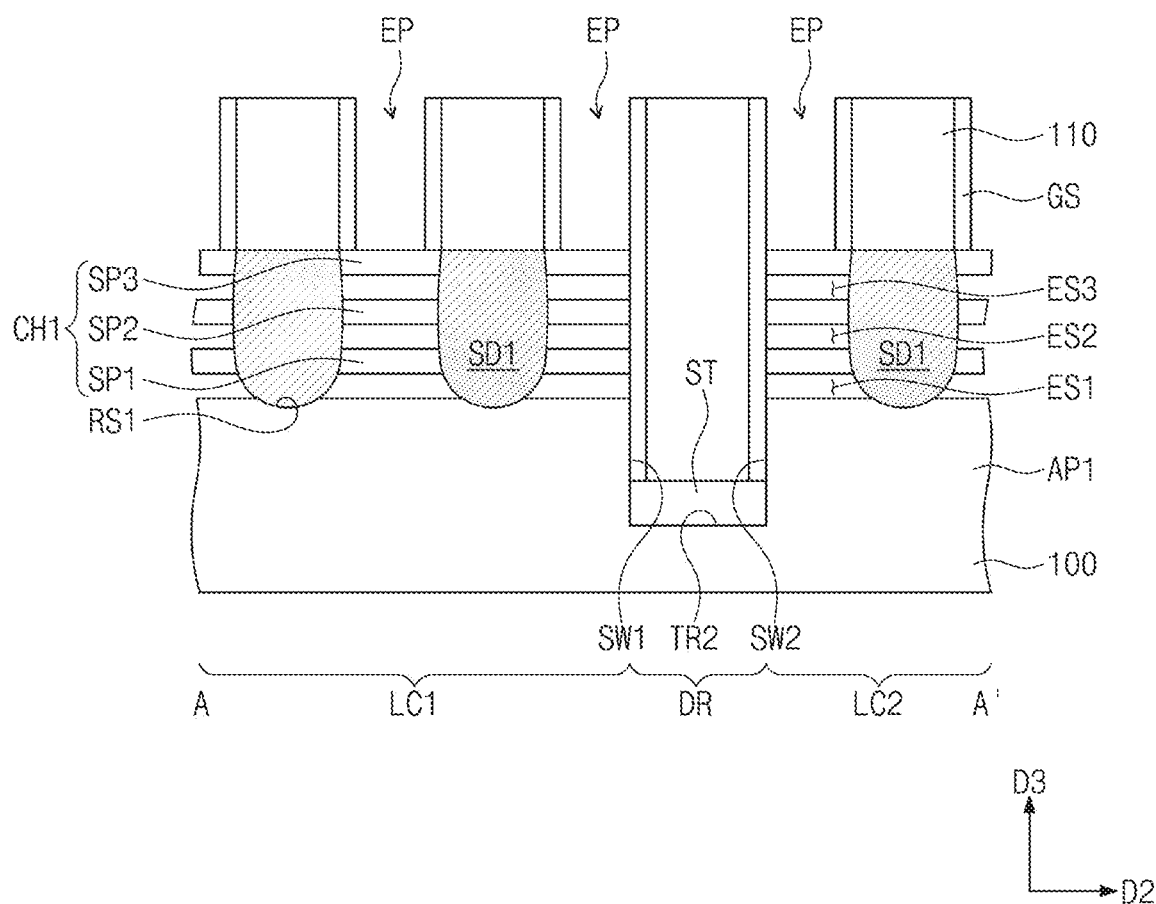
Figure 12B:
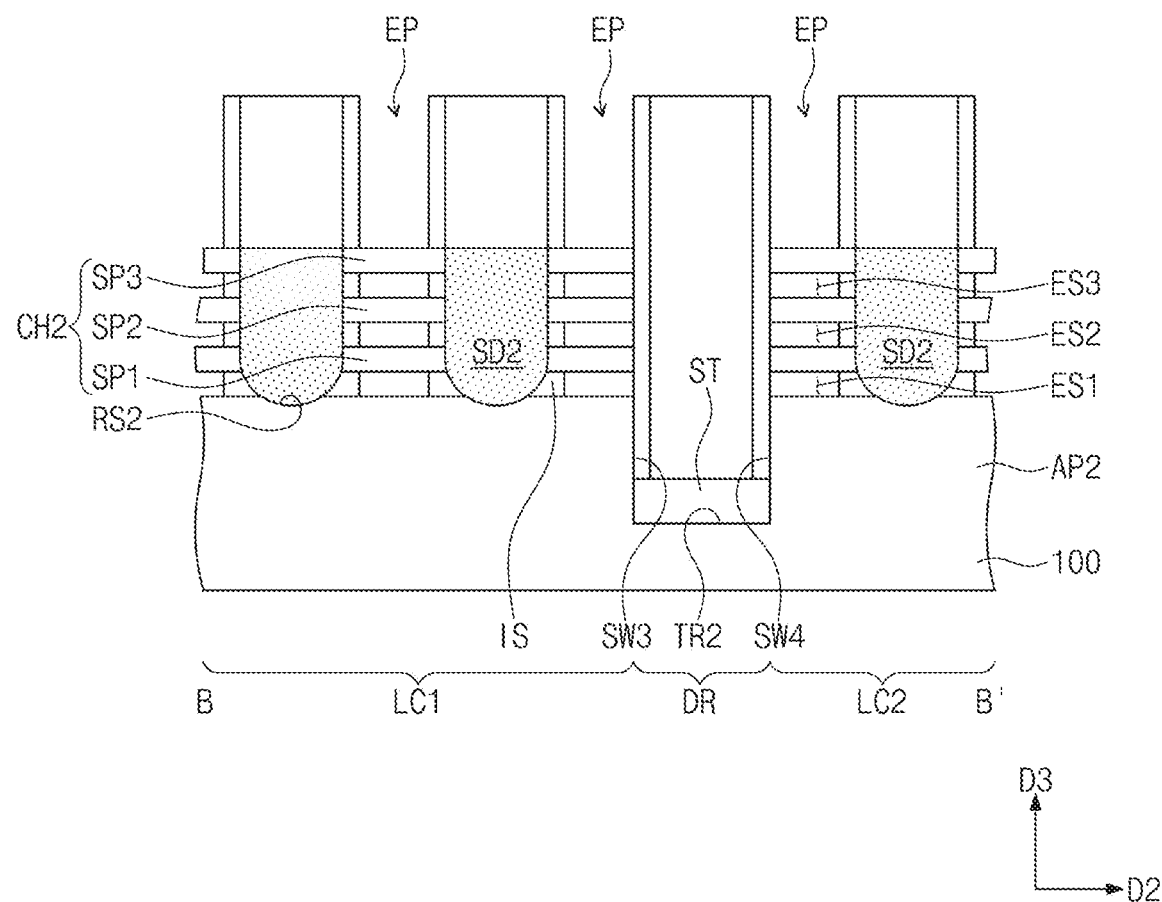
Figure 12C:
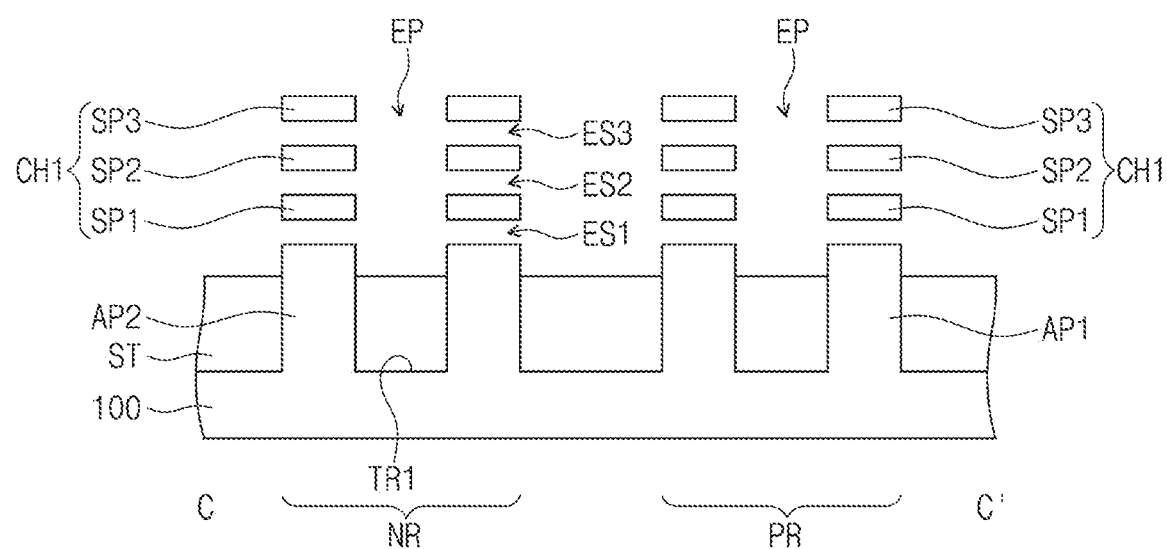
Figure 12C:
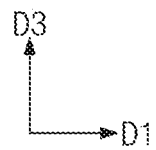
Figure 12D:
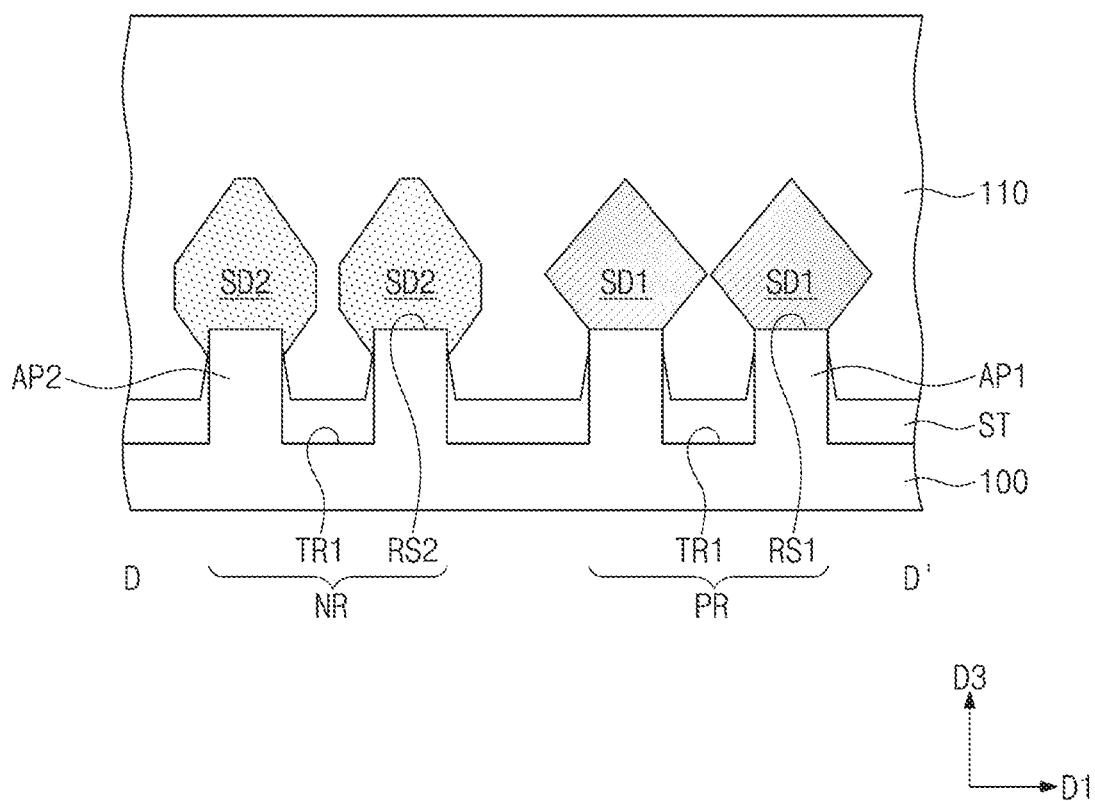

FIGS. 3, 5, 7, 9, and 11 illustrate plan views showing a method of manufacturing a semiconductor device according to some example embodiments of the present inventive concepts. FIGS. 4, 6A, 8A, 10A, and 12A illustrate cross-sectional views taken along line A-A' of FIGS. 3, 5, 7, 9, and 11, respectively. FIGS. 6B, 8B, 10B, and 12B illustrate cross-sectional views taken along line B-B' of FIGS. 5, 7, 9, and 11, respectively. FIGS. 10C and 12C illustrate cross-sectional views taken along line C-C' of FIGS. 9 and 11, respectively. FIGS. 10D and 12D illustrate cross-sectional views taken along line D-D' of FIGS. 9 and 11, respectively.

Figure 3:
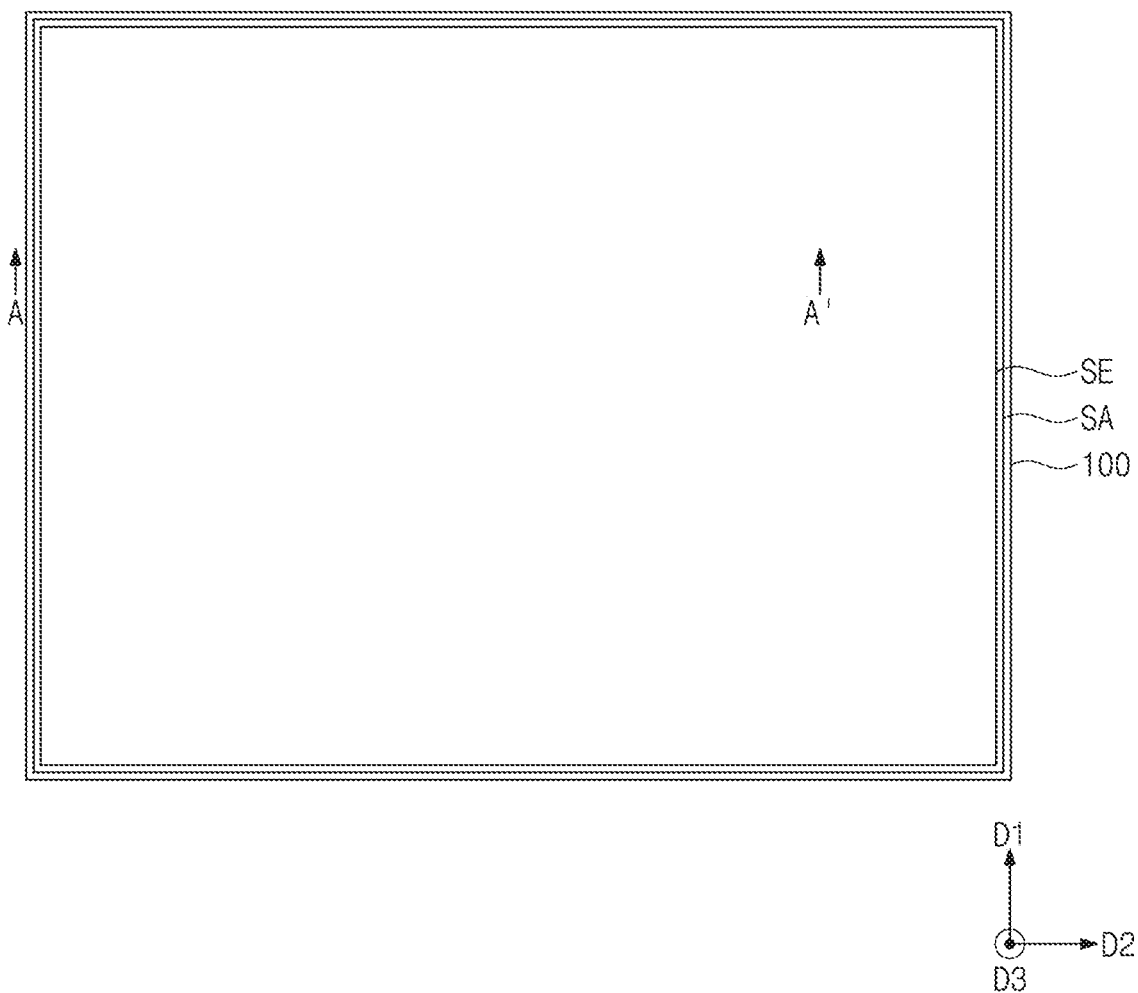
FIGS. 3, 5, 7, 9, and 11 illustrate plan views showing a method of manufacturing a semiconductor device according to some example embodiments of the present inventive concepts.
Figure 4:
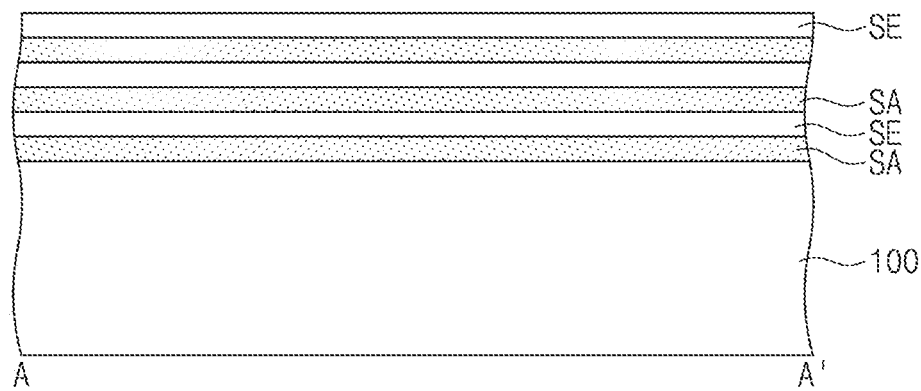
FIGS. 4, 6A, 8A, 10A, and 12A illustrate cross-sectional views taken along line A-A' of FIGS. 3, 5, 7, 9, and 11, respectively.
Figure 4:
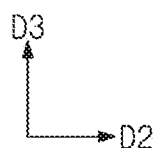

Referring to FIGS. 3 and 4, sacrificial layers SA and semiconductor layers SE may be alternately and repeatedly stacked on an entire surface of a substrate 100. The semiconductor layers SE may be repeatedly stacked three times, but the present inventive concepts are not limited thereto. For example, the sacrificial layers SA may include a material having an etch selectivity with respect to the semiconductor layers SE. In this sense, the semiconductor layers SE may include a material that substantially cannot be etched in a process in which the sacrificial layers SA are etched. In certain embodiments, in a process in which the sacrificial layers SA are etched, an etch rate ratio of the sacrificial layers SA to the semiconductor layers SE may fall within a range from about 10:1 to about 200:1. For example, the sacrificial layers SA may include silicon-germanium (SiGe) or germanium (Ge), and the semiconductor layers SE may include silicon (Si).

The sacrificial layers SA and the semiconductor layers SE may be formed by an epitaxial growth process in which the substrate 100 is used as a seed layer. The sacrificial layers SA and the semiconductor layers SE may be successively formed in the same chamber. The sacrificial layers SA and the semiconductor layers SE may be conformally grown on the entire surface of the substrate 100.

Figure 5:
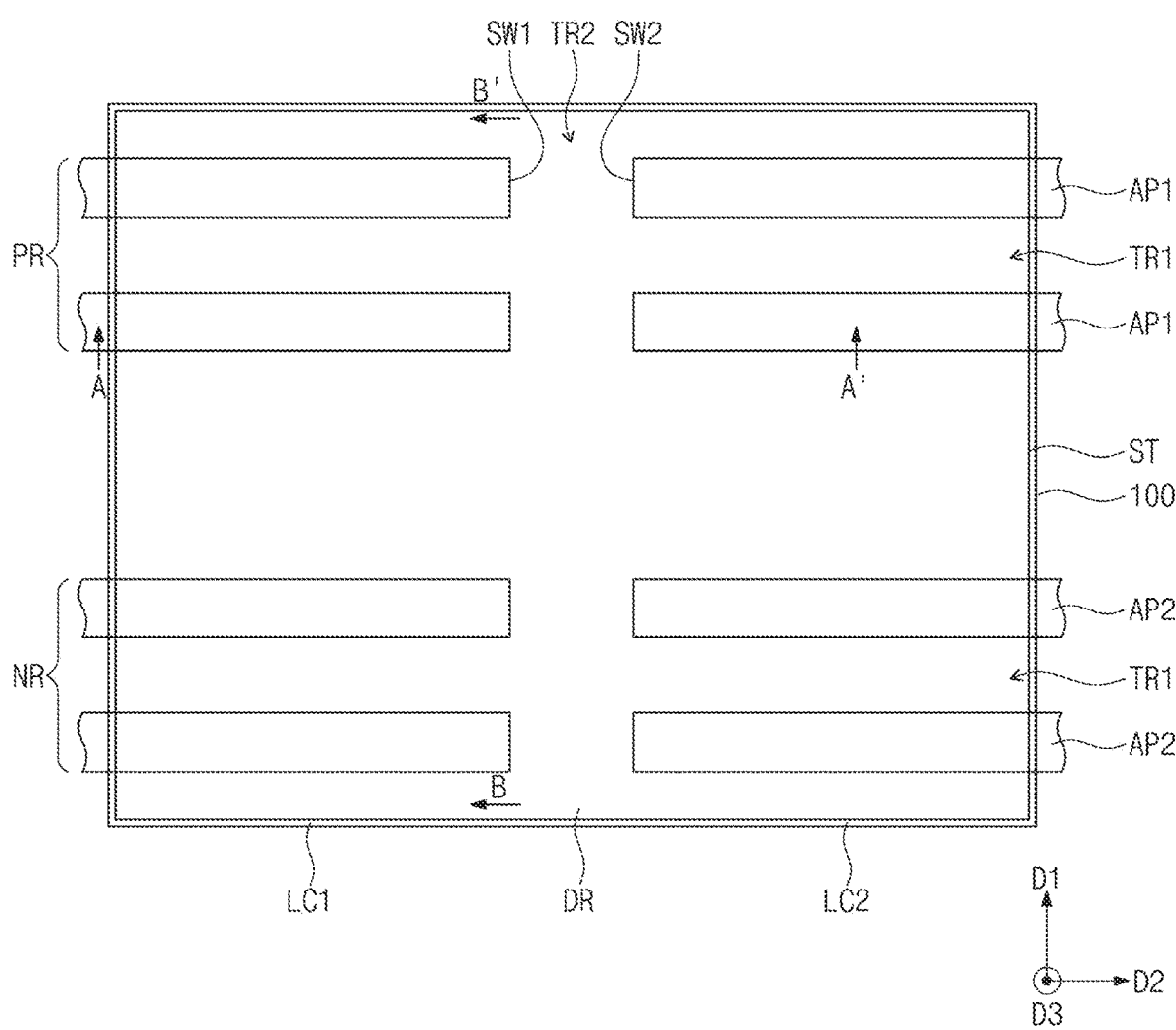
Figure 6A:
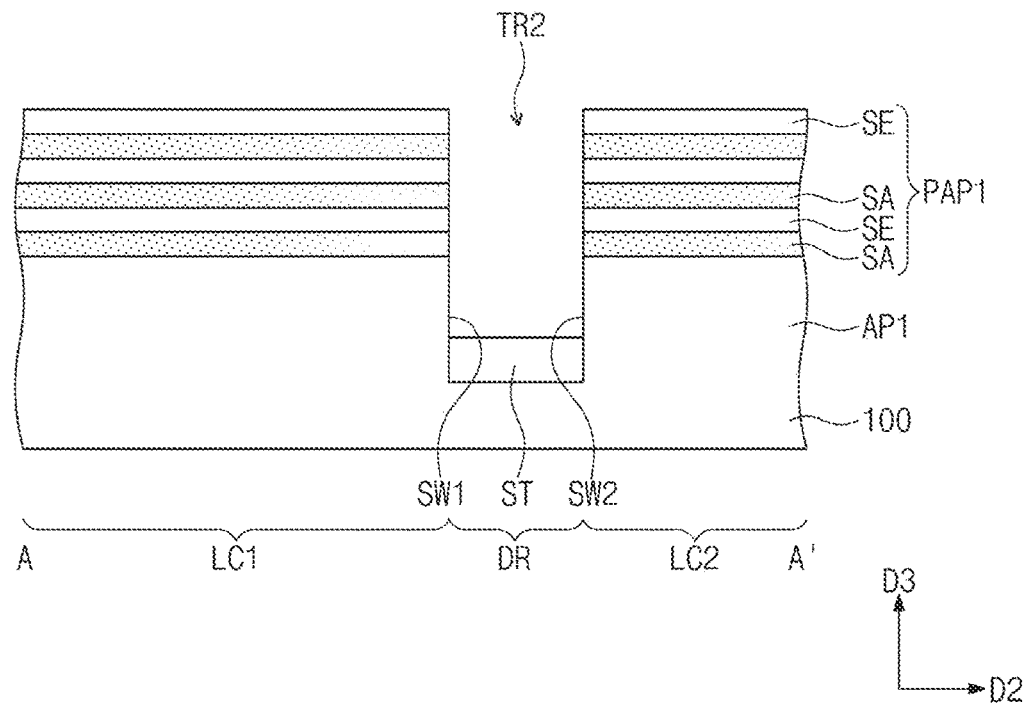
Figure 6B:
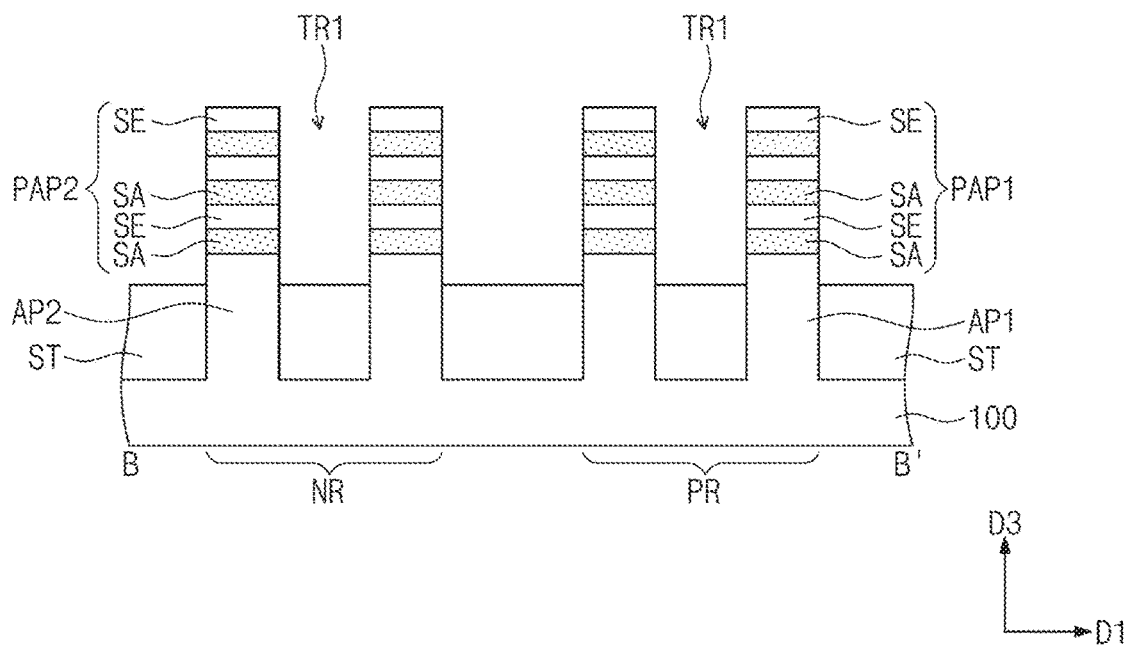
FIGS. 6B, 8B, 10B, and 12B illustrate cross-sectional views taken along line B-B' of FIGS. 5, 7, 9, and 11, respectively.

Referring to FIGS. 5, 6A, and 6B, the sacrificial layers SA and the semiconductor layers SE may be patterned to form first and second preliminary patterns PAP1 and PAP2 respectively on PMOSFET and NMOSFER regions PR and NR of the substrate 100. When the sacrificial layers SA and the semiconductor layers SE are patterned, an upper portion of the substrate 100 may be etched to form a first trench TR1 and a second trench TR2 that define first and second active patterns AP1 and AP2. The first and second active patterns AP1 and AP2 may be formed respectively on the PMOSFET and NMOSFET regions PR and NR of the substrate 100.

The first trench TR1 may extend in a second direction D2 and may define a sidewall in the second direction D2 of each of the first and second active patterns AP1 and AP2. For example, the first trench TR1 may be formed either between the first active patterns AP1 adjacent to each other in the first direction D1 or between the second active patterns AP2 adjacent to each other in the first direction D1.

The second trench TR2 may define a cell boundary between first and second logic cells LC1 and LC2, while extending in the first direction D1. The second trench TR2 may be formed on a division region DR between the first and second logic cells LC1 and LC2. The second trench TR2 may define a sidewall in the first direction D1 of each of the first and second active patterns AP1 and AP2, while extending in the first direction D1. For example, of a pair of the first active patterns AP1 adjacent to each other in the second direction D2, one may have a first sidewall SW1 defined by the second trench TR2 and the other may have a second sidewall SW2 defined by the second trench TR2. The first and second sidewalls SW1 and SW2 may face each other in the second direction D2 across the second trench TR2.

The first and second preliminary patterns PAP1 and PAP2 may be disposed respectively on the first and second active patterns AP1 and AP2. The first and second preliminary patterns PAP1 and PAP2 may vertically overlap the first and second active patterns AP1 and AP2, respectively. For example, the first and second preliminary patterns PAP1 and PAP2 may have planar shapes substantially the same as those of the first and second active patterns AP1 and AP2, respectively. The first and second preliminary patterns PAP1 and PAP2 and the first and second active patterns AP1 and AP2 may each be formed to have a linear or bar shape extending in the second direction D2.

A device isolation layer ST may be formed to fill the first and second trenches TR1 and TR2. The formation of the device isolation layer ST may include forming a dielectric layer on the entire surface of the substrate 100 and recessing the dielectric layer to completely expose the first and second preliminary patterns PAP1 and PAP2. A top surface of the device isolation layer ST may become lower than top surfaces of the first and second active patterns AP1 and AP2.

Figure 7:
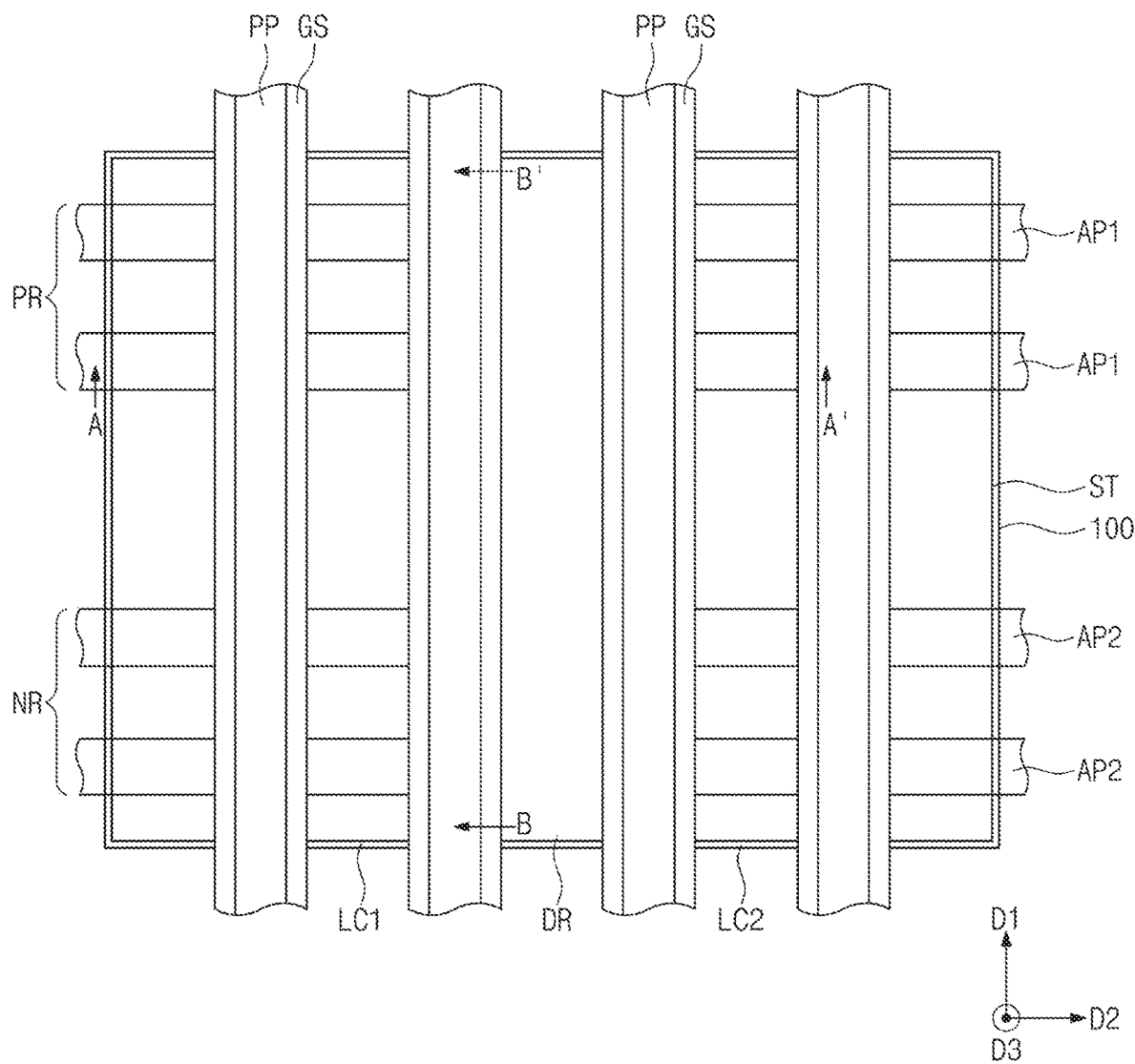
Figure 8A:
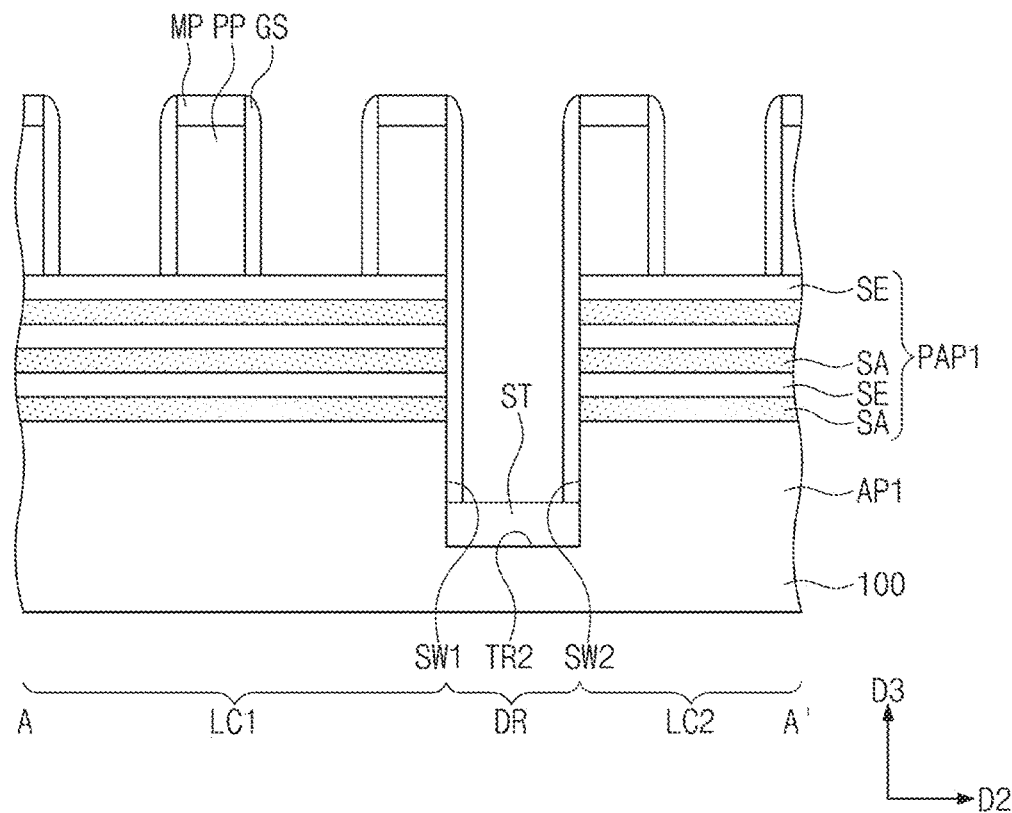
Figure 8B:
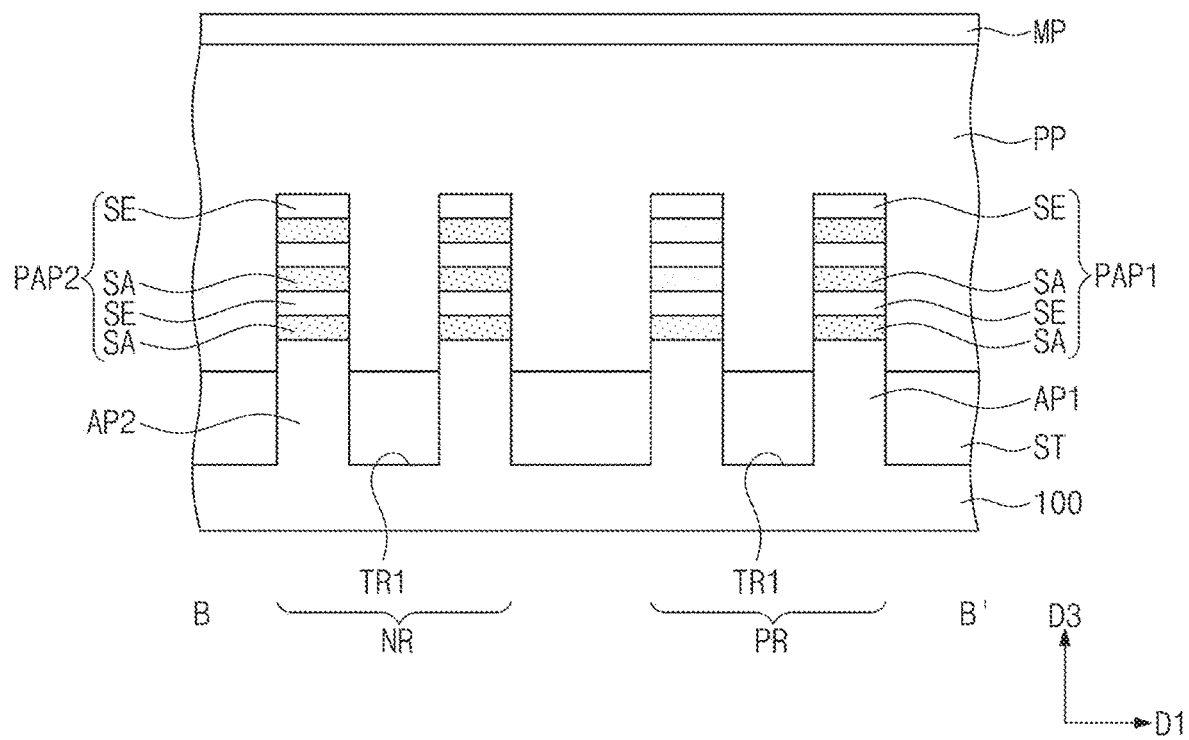
Figure 9:
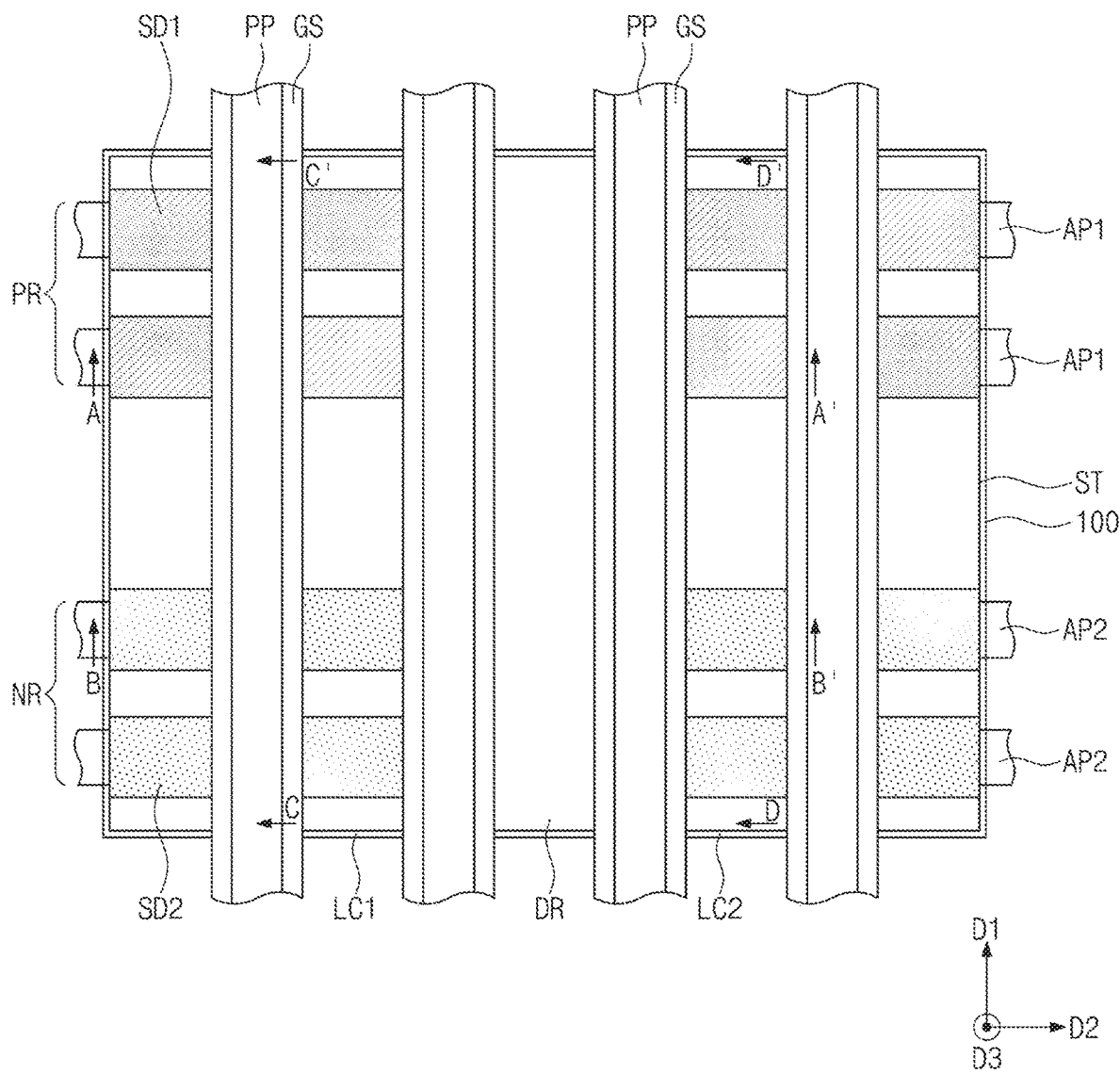

Referring to FIGS. 7, 8A, and 8B, sacrificial patterns PP may be formed to run across the first and second preliminary patterns PAP1 and PAP2. Each of the sacrificial patterns PP may be formed to have a linear or bar shape extending in the first direction D1.

The formation of the sacrificial patterns PP may include forming a sacrificial layer on the substrate 100, forming mask patterns MP on the sacrificial layer, and using the mask patterns MP as an etching mask to etch the sacrificial layer. The sacrificial layer may be formed using, for example, polysilicon. The mask patterns MP may be formed using, for example, a silicon oxide layer, a silicon nitride layer, or a silicon oxynitride layer.

A pair of gate spacers GS may be formed on opposite sidewalls of each of the sacrificial patterns PP. The formation of the gate spacers GS may include performing a deposition process, such as CVD or ALD, to form a spacer layer on the entire surface of the substrate 100, and performing an anisotropic etching process on the spacer layer. For example, the gate spacers GS may include one or more of SiCN, SiCON, and SiN.

The gate spacer GS on the division region DR may downwardly extend from a sidewall of the sacrificial pattern PP adjacent to the division region DR toward the device isolation layer ST filing the second trench TR2. The gate spacer GS on the division region DR may cover its adjacent sidewall of one of the first and second preliminary patterns PAP1 and PAP2. The gate spacer GS on the division region DR may cover its adjacent upper sidewall of one of the first and second sidewalls SW1 and SW2 of the first active pattern AP1.

Referring to FIGS. 9 and 10A to 10D, the mask patterns MP and the gate spacers GS may be used as an etching mask to etch the first and second preliminary patterns PAP1 and PAP2 to respectively form first and second channel patterns CH1 and CH2. The semiconductor layers SE of each of the first and second preliminary patterns PAP1 and PAP2 may be patterned to form first, second, and third semiconductor patterns SP1, SP2, and SP3. Each of the first and second channel patterns CH1 and CH2 may include the first, second, and third semiconductor patterns SP1, SP2, and SP3.

The first and second preliminary patterns PAP1 and PAP2 may be etched to respectively form first and second recesses RS1 and RS2. The first channel pattern CH1 may be placed between a pair of neighboring first recesses RS1, and the second channel pattern CH2 may be placed between a pair of neighboring second recesses RS2.

The sacrificial layers SA on the NMOSFET region NR may be partially removed to form depressions DE. The formation of the depressions DE may include forming a hardmask pattern to selectively expose the NMOSFET region NR, and performing an isotropic etching process to isotropically etch portions of the sacrificial layers SA exposed to the second recesses RS2. For example, when the first, second, and third semiconductor patterns SP1, SP2, and SP3 include silicon (Si), and when the sacrificial layers SA include silicon-germanium (SiGe), the formation of the depressions DE may include performing an etching process that uses an etchant including, for example, peracetic acid.

Inner spacers IS may be formed to fill the depressions DE. For example, the formation of the inner spacers IS may include conformally forming a dielectric layer to fill the depressions DE on the NMOSFET region NR, and performing an isotropic etching process to isotropically etch portions of the dielectric layer. The dielectric layer may include, for example, a silicon nitride layer.

First source/drain patterns SD1 may be formed to fill the first recesses RS1. The formation of the first source/drain patterns SD1 may include performing a selective epitaxial growth process in which the first active pattern AP1 and the first, second, and third semiconductor patterns SP1, SP2, and SP3 on the first active pattern AP1 are used as seed layers. The first source/drain patterns SD1 may be formed of a material that provides the first channel patterns CH1 with compressive strain. For example, the first source/drain patterns SD1 may be formed of a semiconductor element (e.g., SiGe) whose lattice constant is greater than that of a semiconductor element of the substrate 100. Simultaneously with or after the selective epitaxial growth process, the first source/drain patterns SD1 may be doped with p-type impurities.

Second source/drain patterns SD2 may be formed to fill the second recesses RS2. The formation of the second source/drain patterns SD2 may include performing a selective epitaxial growth process in which the second active pattern AP2 and the first, second, and third semiconductor patterns SP1, SP2, and SP3 on the second active pattern AP2 are used as seed layers. For example, the second source/drain patterns SD2 may be formed of the same semiconductor element (e.g., Si) as that of the substrate 100. Simultaneously with or after the selective epitaxial growth process, the second source/drain patterns SD2 may be doped with n-type impurities.

Referring to FIGS. 11 and 12A to 12D, a first interlayer dielectric layer 110 may be formed on the substrate 100. A planarization process may be performed on the first interlayer dielectric layer 110 until top surfaces of the sacrificial patterns PP are exposed. The planarization process may include an etch-back process and/or a chemical mechanical polishing (CMP) process. When the first interlayer dielectric layer 110 is planarized, the mask patterns MP may also be removed. The first interlayer dielectric layer 110 may be formed using, for example, a silicon oxide layer or a silicon oxynitride layer.

A removal process may be performed to selectively remove the sacrificial patterns PP exposed when the planarization process is carried out. The removal of the sacrificial patterns PP may form an empty space EP between a pair of neighboring gate spacers GS. The empty spaces EP may expose the sacrificial layers SA and the first and second channel patterns CH1 and CH2.

A selective etching process may be performed to selectively remove the sacrificial layers SA exposed to the empty spaces EP. For example, when the sacrificial layers SA include silicon-germanium (SiGe), and when the first, second, and third semiconductor patterns SP1, SP2, and SP3 include silicon (Si), the selective etching process may use an etchant including, for example, peracetic acid. The etchant may further include, for example, hydrofluoric acid (HF) solution and deionized water. The selective removal of the sacrificial layers SA may form first, second, and third cavities ES1, ES2, and ES3. The first, second, and third cavities ES1, ES2, and ES3 may be spatially connected to the empty space EP, and therefore, each of the first, second, and third semiconductor patterns SP1, SP2, and SP3 may be exposed on its top and bottom surfaces and its sidewalls.

Referring back to FIG. 12A, the first cavity ES1 on the PMOSFET region PR may be defined between the first active pattern AP1 and the first semiconductor pattern SP1, the second cavity ES2 may be defined between the first semiconductor pattern SP1 and the second semiconductor pattern SP2, and the third cavity ES3 may be defined between the second semiconductor pattern SP2 and the third semiconductor pattern SP3.

Referring back to FIG. 12B, the first cavity ES1 on the NMOSFET region NR may be defined between the second active pattern AP2 and the first semiconductor pattern SP1, the second cavity ES2 may be defined between the first semiconductor pattern SP1 and the second semiconductor pattern SP2, and the third cavity ES3 may be defined between the second semiconductor pattern SP2 and the third semiconductor pattern SP3.

In certain embodiments, the gate spacer GS may close one side of the empty space EP adjacent to the division region DR. In this configuration, during the selective etching process, the sacrificial layers SA adjacent to the division region DR may be etched at the same etch rate as that at which other sacrificial layers SA are etched. For example, during the selective etching process, no over-etching may be performed on the sacrificial layers SA adjacent to the division region DR. Accordingly, the first and second source/drain patterns SD1 and SD2 adjacent to the division region DR may be possibly prevented from damage caused by attack of the etchant.

Referring back to FIGS. 1 and 2A to 2D, a gate dielectric pattern GI and a gate electrode GE may be formed in each of the empty spaces EP. The formation of the gate dielectric pattern GI and the gate electrode GE may include, for example, conformally forming a gate dielectric layer in the empty space EP and the first, second, and third cavities ES1, ES2, and ES3, and forming a gate electrode layer to completely fill the empty space EP and the first, second, and third cavities ES1, ES2, and ES3. The gate electrode layer may completely fill the first, second, and third cavities ES1, ES2, and ES3, and thus first to third segments GP1 to GP3 of the gate electrode GE may be formed respectively in the first to third cavities ES1 to ES3. The gate electrode layer may fill the empty space EP, and thus a fourth segment GP4 of the gate electrode GE may be formed in the empty space EP. The gate dielectric layer may include, for example, a high-k dielectric material. The gate electrode layer may include one or more of metal nitride and metal.

Gate capping patterns CP may be formed on the gate electrodes GE. For example, the gate capping patterns CP may include one or more of SiON, SiCN, SiCON, and SiN. A second interlayer dielectric layer 120 may be formed on the first interlayer dielectric layer 110 and the gate capping patterns CP. Contacts CT may be formed to penetrate the first and second interlayer dielectric layers 110 and 120 and to have connection with the first and second source/drain patterns SD1 and SD2.

Figure 13:
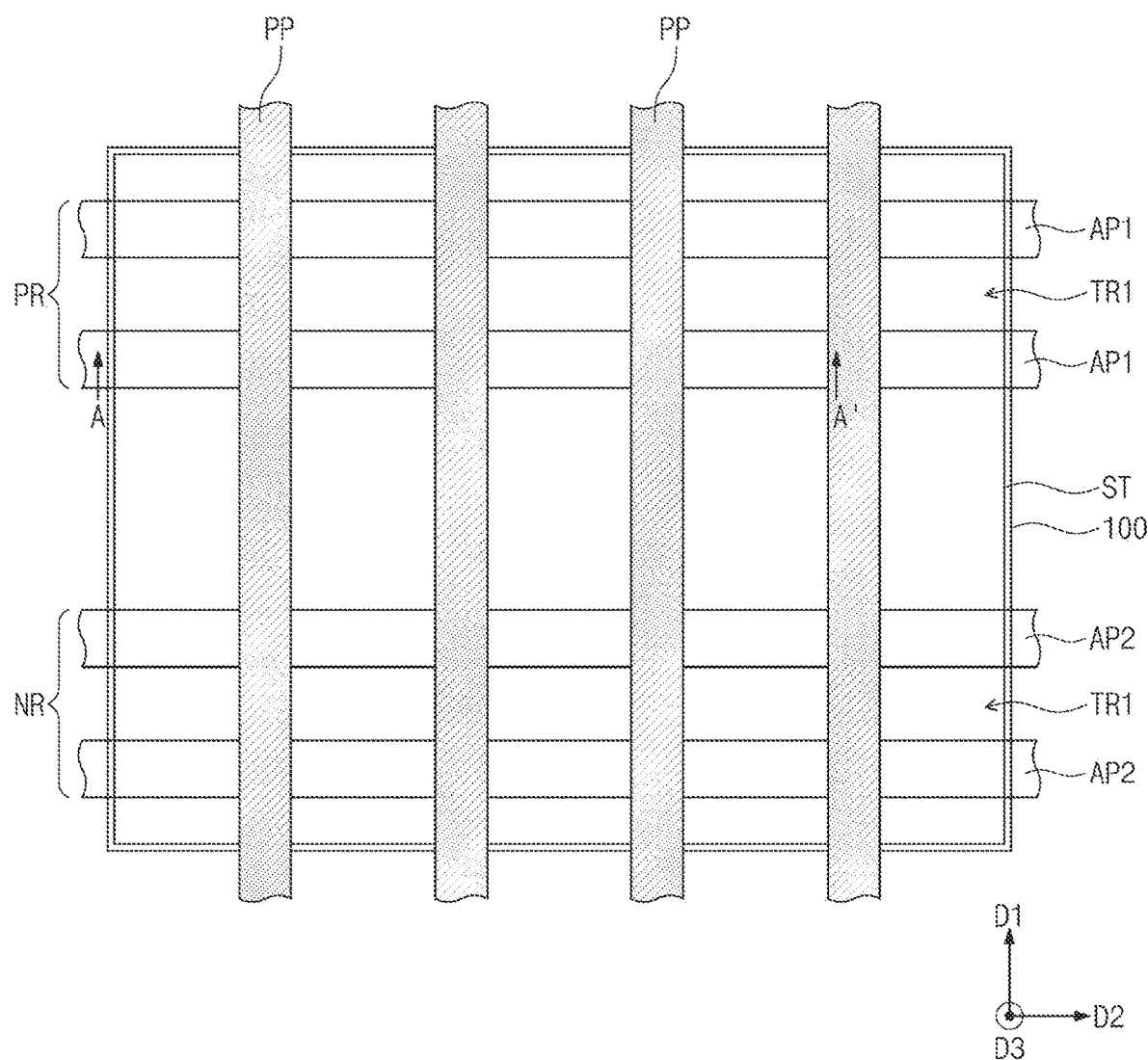
FIGS. 13 and 15 illustrate plan views showing a method of manufacturing a semiconductor device according to some example embodiments of the present inventive concepts.
Figure 14:
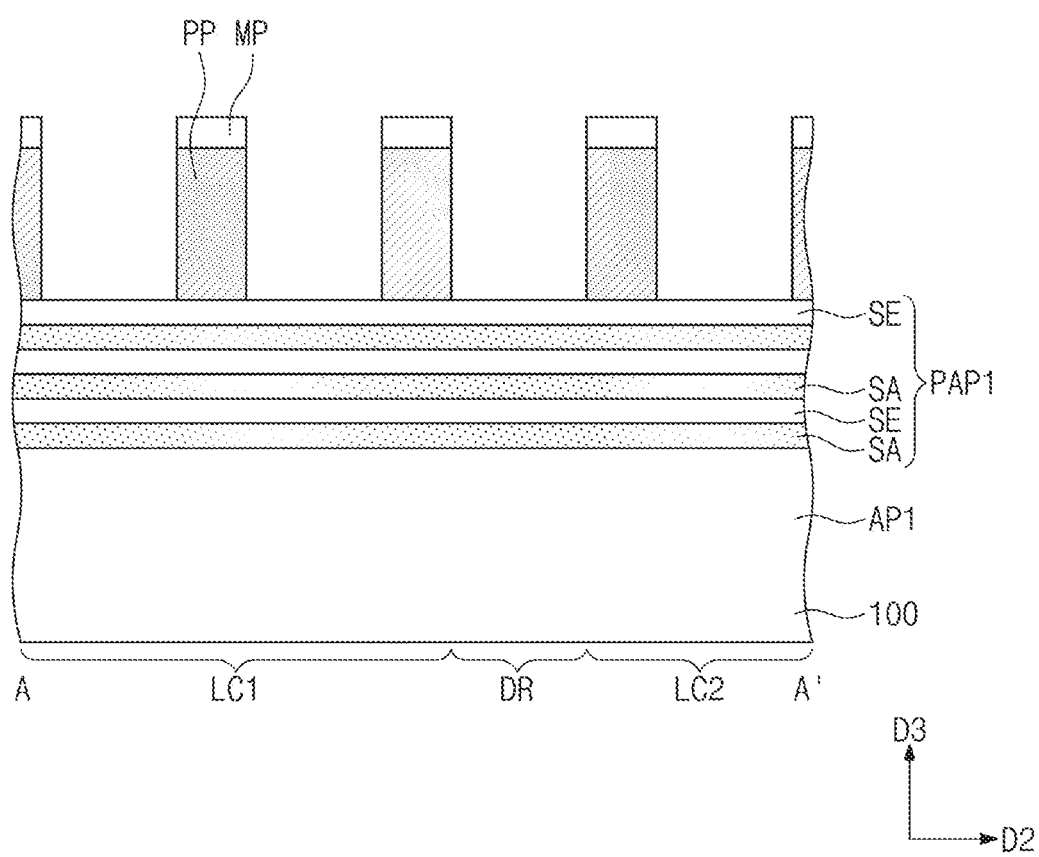
FIGS. 14 and 16 illustrate cross-sectional views taken along line A-A' of FIGS. 13 and 15, respectively.
Figure 15:
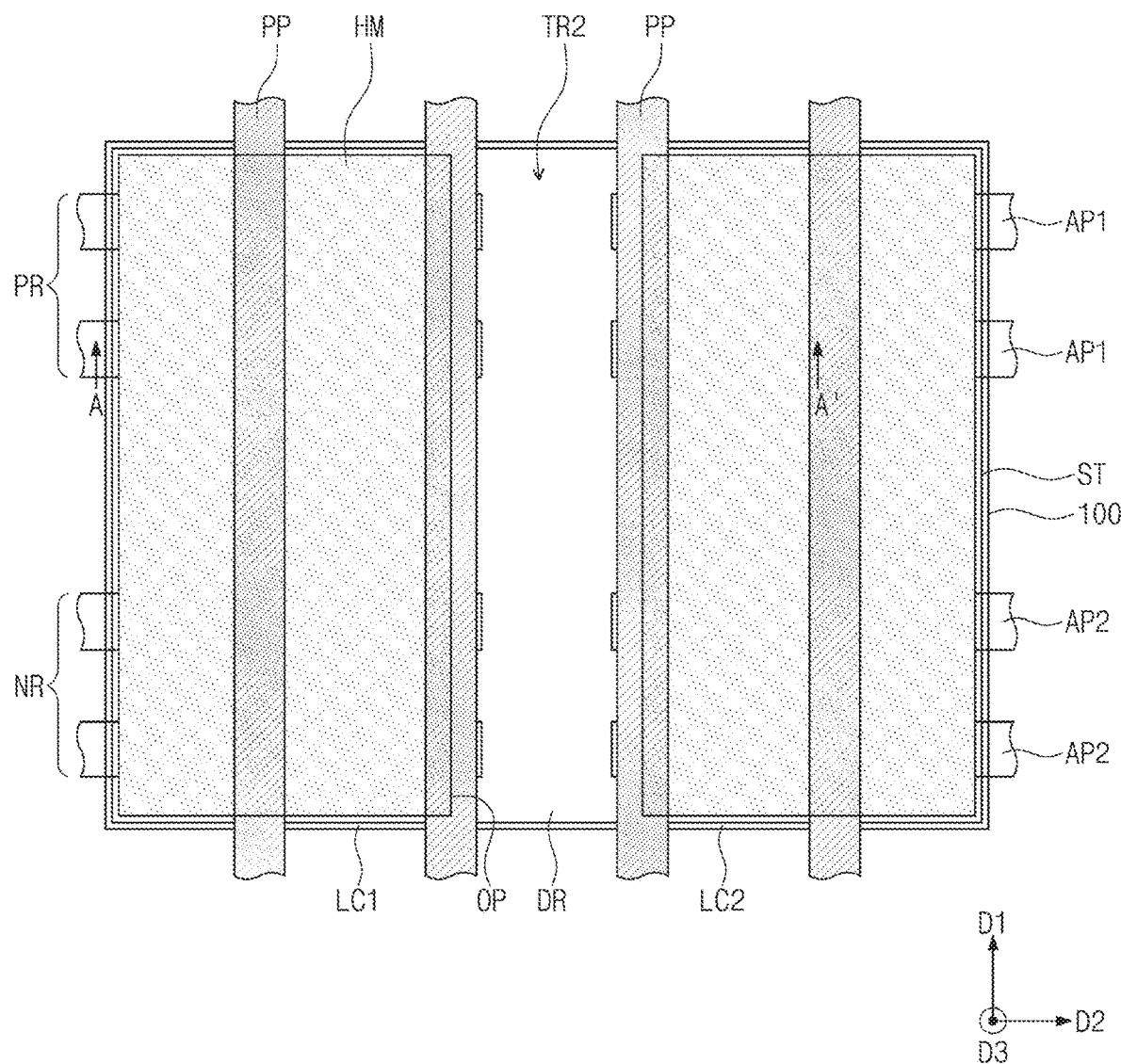
Figure 16:
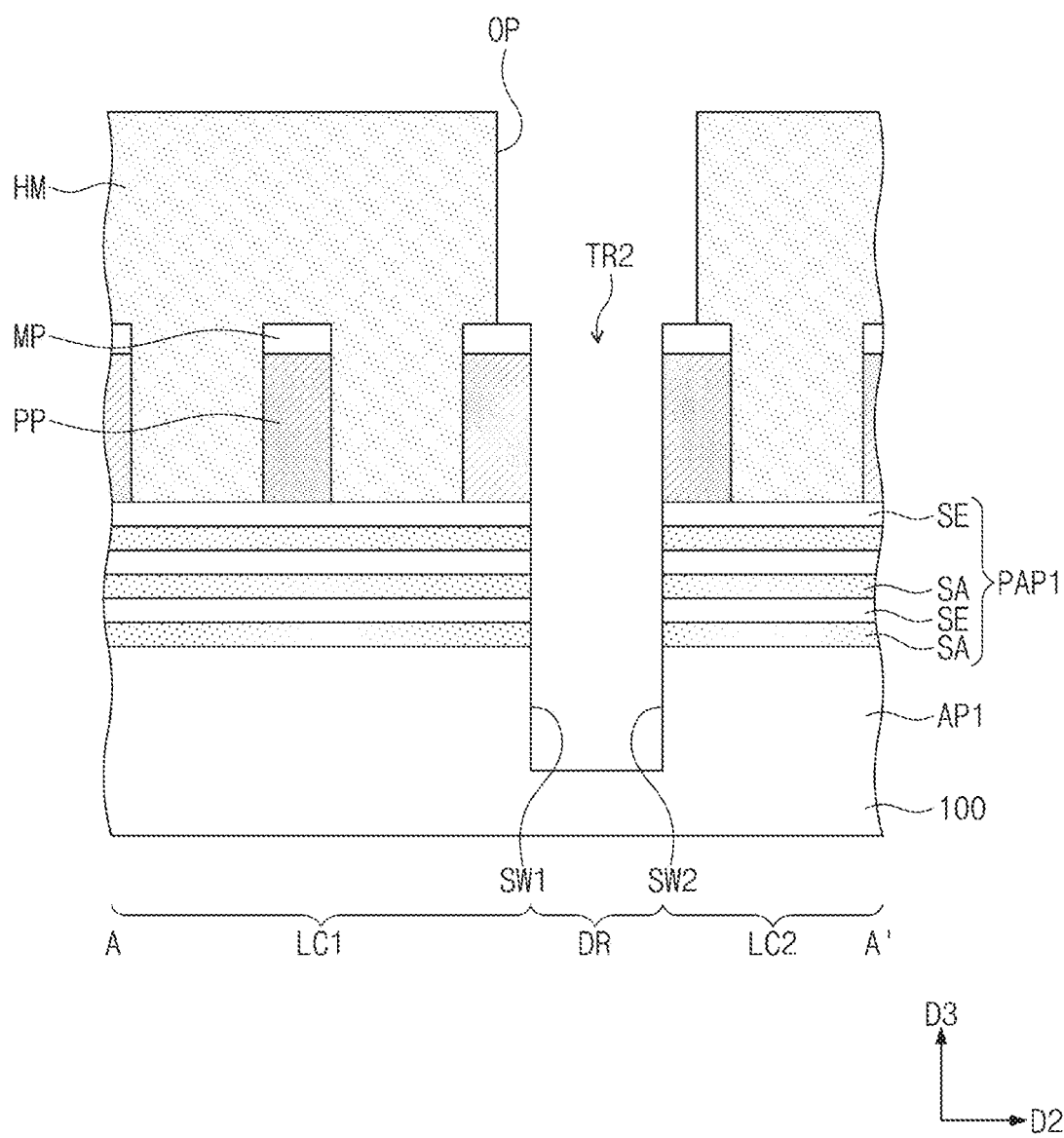

FIGS. 13 and 15 illustrate plan views showing a method of manufacturing a semiconductor device according to some example embodiments of the present inventive concepts. FIGS. 14 and 16 illustrate cross-sectional views taken along line A-A' of FIGS. 13 and 15, respectively. In the embodiment that follows, a detailed description of technical features repetitive to those discussed above with reference to FIGS. 1 to 12D may be omitted, and differences from those discussed above with reference to FIGS. 1 to 12D may be discussed in detail.

Referring to FIGS. 13 and 14, the sacrificial layers SA and the semiconductor layers SE may be formed on the substrate 100. The sacrificial layers SA and the semiconductor layers SE may be patterned to form the first trench TR1 that defines the first and second active patterns AP1 and AP2. Differently from that discussed above with reference to FIGS. 5, 6A, and 6B, the second trench TR2 may not be formed. The device isolation layer ST may be formed to fill the first trench TR1.

The mask patterns MP may be formed, and the sacrificial patterns PP may be formed under the mask patterns MP. The sacrificial patterns PP may be formed to run across the first and second preliminary patterns PAP1 and PAP2.

Referring to FIGS. 15 and 16, a hardmask pattern HM may be formed on the first and second logic cells LC1 and LC2. The hardmask pattern HM may include an opening OP that exposes the division region DR between the first and second logic cells LC1 and LC2. For example, the hardmask pattern HM may selectively expose the division region DR, while covering the first and second logic cells LC1 and LC2. The opening OP may partially expose the mask pattern MP and the sacrificial pattern PP.

The exposed division region DR may undergo an etching process to form the second trench TR2 extending in the first direction D1. The etching process may include using the hardmask pattern HM and the mask pattern MP that is exposed to the opening OP as an etching mask to pattern the first and second preliminary patterns PAP1 and PAP2. As a result, the mask pattern MP exposed to the opening OP may form the second trench TR2 in a self-alignment manner. The device isolation layer ST may be additionally formed to fill the second trench TR2.

Subsequent processes may be the same as those discussed above with reference to FIGS. 7 to 12D.

Figure 17A:
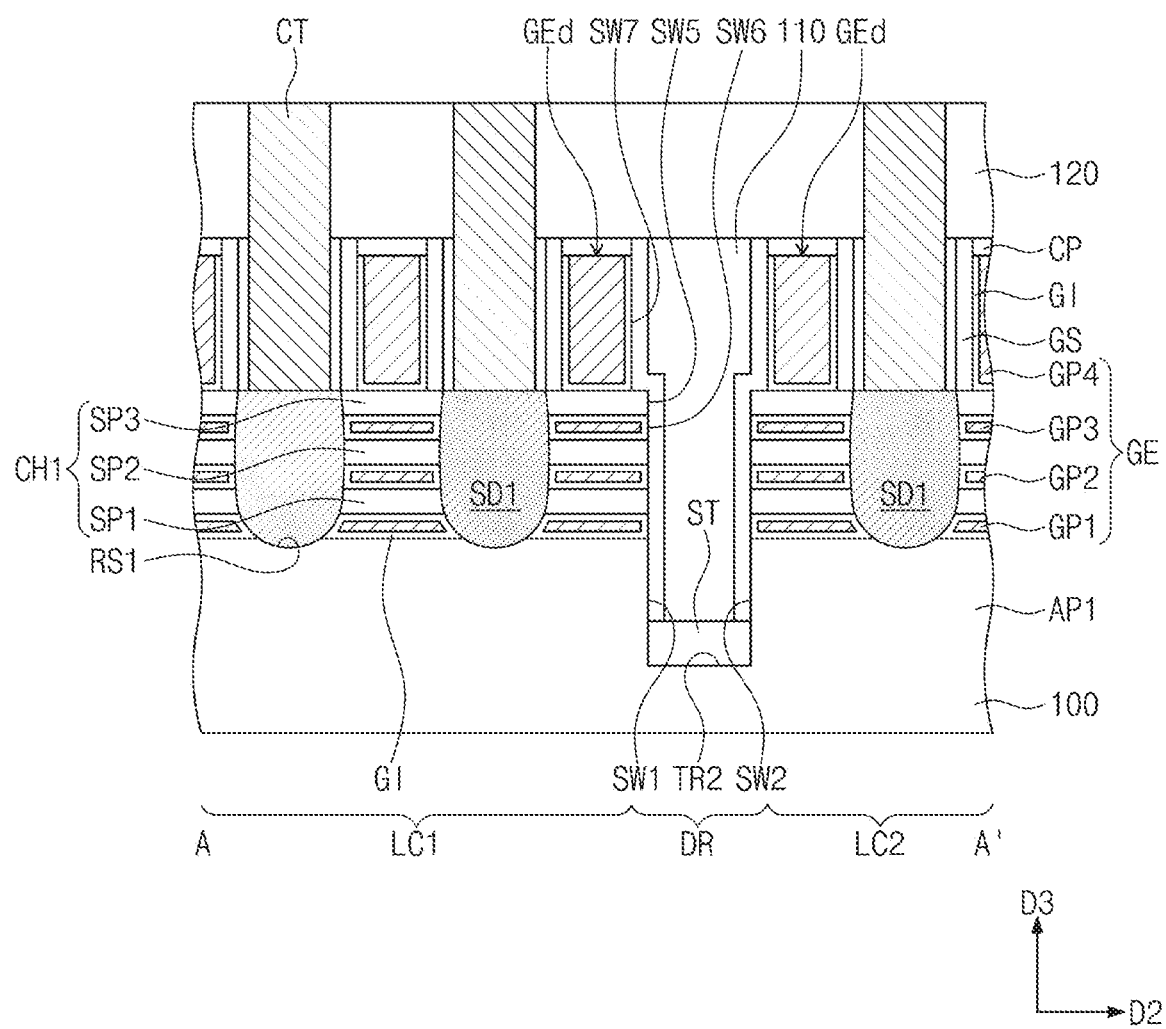
FIGS. 17A and 17B illustrate cross-sectional views respectively taken along lines A-A' and B-B' of FIG. 1, showing a semiconductor device according to some example embodiments of the present inventive concepts.
Figure 17B:
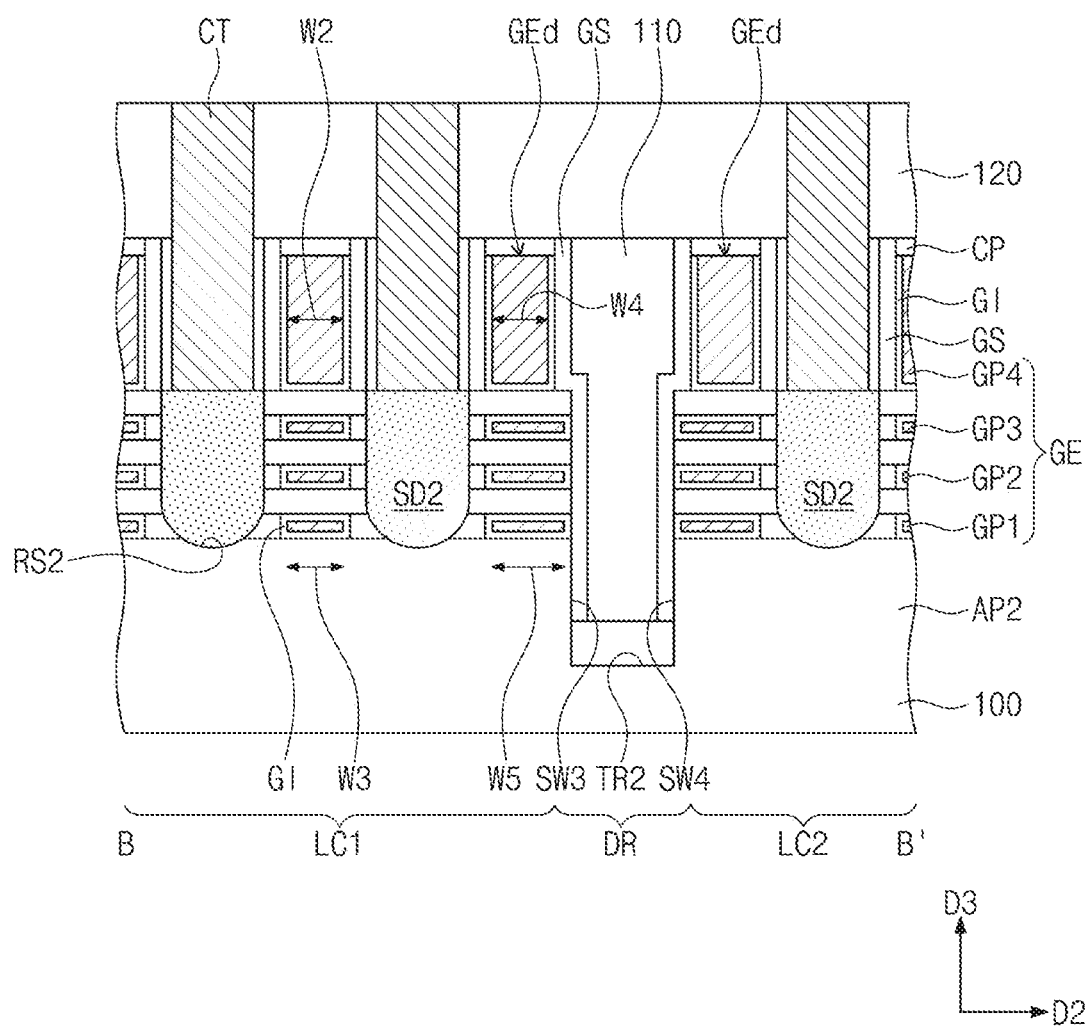

FIGS. 17A and 17B illustrate cross-sectional views respectively taken along lines A-A' and B-B' of FIG. 1, showing a semiconductor device according to some example embodiments of the present inventive concepts. In the embodiment that follows, a detailed description of technical features repetitive to those discussed above with reference to FIGS. 1 and 2A to 2D may be omitted, and differences from those discussed above with reference to FIGS. 1 and 2A to 2D may be discussed in detail.

Referring to FIGS. 1, 2C, 2D, 17A, and 17B, the gate dielectric pattern GI covering the fourth segment GP4 of the dummy gate electrode GEd may have a seventh sidewall SW7. The fifth sidewall SW5 of the first channel pattern CH1 may not be vertically aligned with the seventh sidewall SW7. For example, the fifth sidewall SW5 of the first channel pattern CH1 may be offset in the second direction D2 from the seventh sidewall SW7. The gate spacer GS on the division region DR may have a stepwise profile between the fifth and seventh sidewalls SW5 and SW7.

The fourth segment GP4 of the gate electrode GE on the NMOSFET region NR may have a width W2 substantially the same as a width W3 of each of the first, second, and third segments GP1, GP2, and GP3 that are under the fourth segment GP4 of the gate electrode GE. The fourth segment GP4 of the dummy gate electrode GEd on the NMOSFET region NR may have a width W4 less than a width W5 of each of the first, second, and third segments GP1, GP2, and GP3 that are under the fourth segment GP4 of the dummy gate electrode GEd. The width W3 of each of the first, second, and third segments GP1, GP2, and GP3 of the gate electrode GE on the NMOSFET region NR may be less than the width W5 of each of the first, second, and third segments GP1, GP2, and GP3 of the dummy gate electrode GEd.

Figure 18:
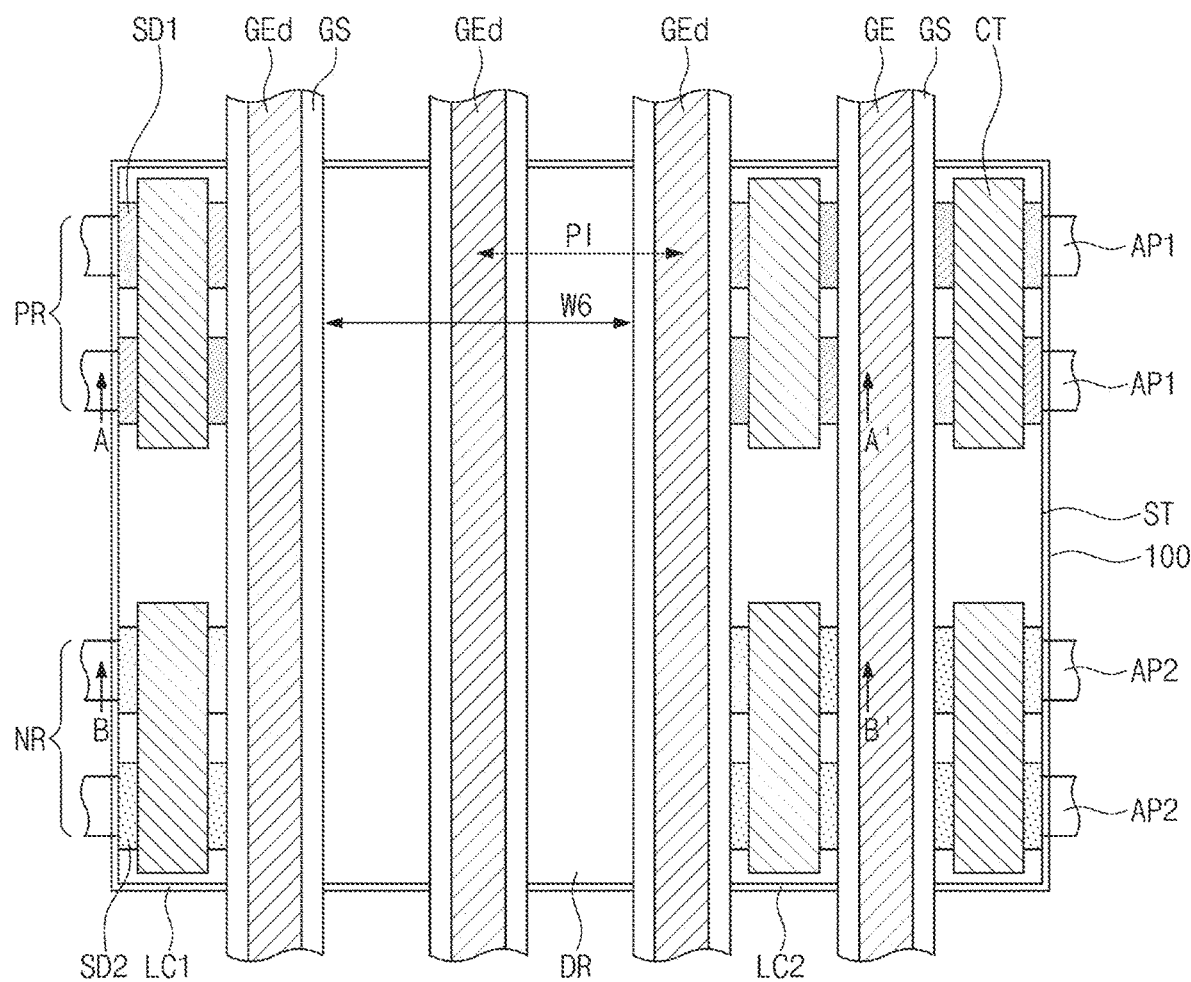
FIG. 18 illustrates a plan view showing a semiconductor device according to some example embodiments of the present inventive concepts.
Figure 19A:
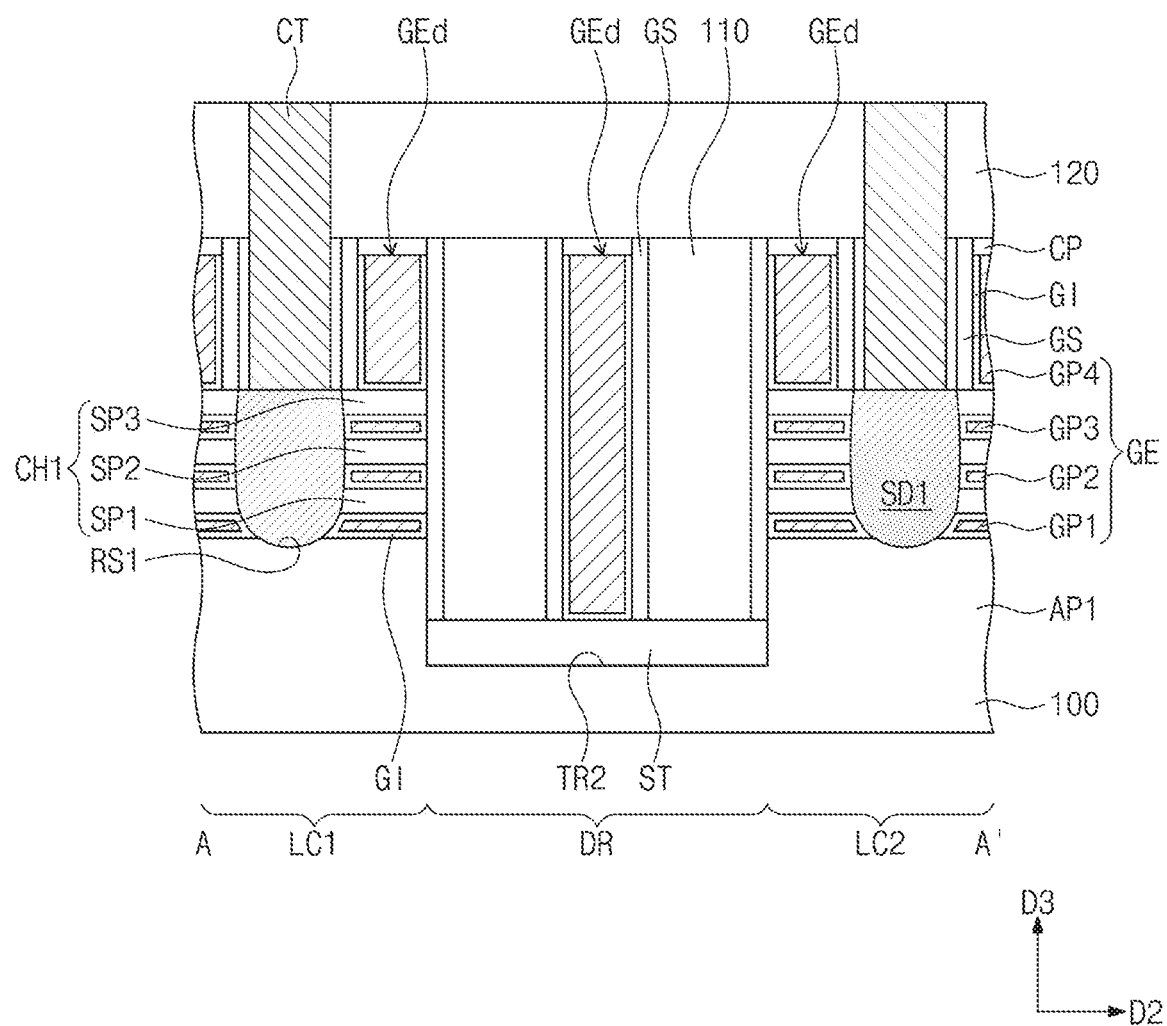
FIGS. 19A and 19B illustrate cross-sectional views respectively taken along lines A-A' and B-B' of FIG. 18.
Figure 19B:
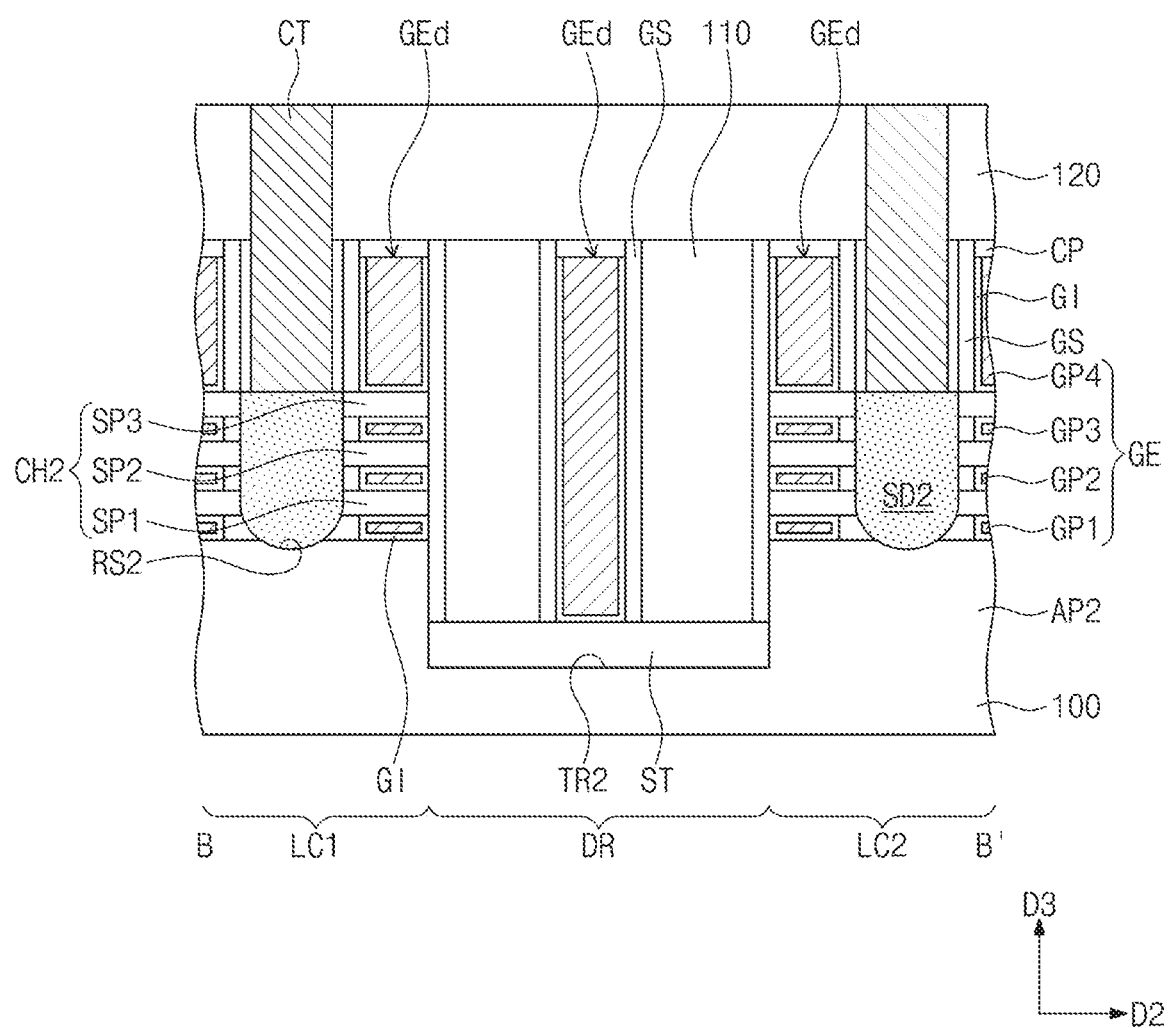

FIG. 18 illustrates a plan view showing a semiconductor device according to some example embodiments of the present inventive concepts. FIGS. 19A and 19B illustrate cross-sectional views respectively taken along lines A-A' and B-B' of FIG. 18. In the embodiment that follows, a detailed description of technical features repetitive to those discussed above with reference to FIGS. 1 and 2A to 2D may be omitted, and differences from those discussed above with reference to FIGS. 1 and 2A to 2D may be discussed in detail.

Referring to FIGS. 18, 19A, and 19B, a width W6 in the second direction D2 of the division region DR may be greater than a pitch P1 of neighboring gate electrodes GE. The pitch P1 of the gate electrodes GE may be a distance between a center of a certain gate electrode GE and a center of other gate electrode GE adjacent to the certain gate electrode GE.

At least one dummy gate electrode GEd may be disposed on the division region DR. For example, at least one dummy gate electrode GEd may cross over the device isolation layer ST filling the second trench TR2.

According to some example embodiments of the present inventive concepts, it may be possible to reduce or prevent degradation of a source/drain pattern adjacent to a division region, which may result in that a semiconductor device may improve in reliability and electrical characteristics.

Although example embodiments of the present inventive concepts have been discussed with reference to accompanying figures, it will be understood that various changes in form and details may be made therein without departing from the spirit and scope of the present inventive concepts. It therefore will be understood that the some example embodiments described above are just illustrative but not limitative in all aspects. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
  a substrate comprising a trench;
  a first channel pattern and a second channel pattern on the substrate, the first channel pattern and the second channel pattern being separated by the trench, each of the first channel pattern and the second channel pattern including a plurality of semiconductor patterns that are spaced apart from each other and are stacked in a vertical direction;
  a device isolation layer in the trench;
  a first gate electrode and a second gate electrode on the first channel pattern and the second channel pattern, respectively, the first and second gate electrodes being adjacent to the trench; and
  a first gate spacer on a first sidewall of the first gate electrode,
  wherein the first gate spacer covers a second sidewall of an uppermost semiconductor pattern of the first channel pattern, and
  wherein the first gate spacer has a stepwise profile between the first sidewall and the second sidewall.

2. The semiconductor device of claim 1, wherein a top surface of the uppermost semiconductor pattern of the first channel pattern includes a first region on which the first gate electrode is and a second region covered by the first gate spacer.

3. The semiconductor device of claim 1, wherein the uppermost semiconductor pattern of the first channel pattern protrudes beyond the first sidewall of the first gate electrode toward the second channel pattern.

4. The semiconductor device of claim 1, wherein the first gate spacer extends from the first sidewall onto the second sidewall.

5. The semiconductor device of claim 1, further comprising a second gate spacer on a third sidewall of the second gate electrode,
- wherein the first sidewall of the first gate electrode and the third sidewall of the second gate electrode face each other,
- wherein the second gate spacer covers a fourth sidewall of an uppermost semiconductor pattern of the second channel pattern, and
- wherein the second gate spacer has a stepwise profile between the third sidewall and the fourth sidewall.

6. The semiconductor device of claim 1, wherein the first gate electrode includes:
- a first portion between a lowermost semiconductor pattern of the first channel pattern and the substrate; and
- a second portion on the uppermost semiconductor pattern of the first channel pattern,
- wherein a width of the first portion is greater than a width of the second portion.

7. The semiconductor device of claim 1, further comprising a gate dielectric pattern between the first gate electrode and the first channel pattern,
- wherein the gate dielectric pattern on the first sidewall of the first gate electrode comprises a third sidewall covered by the first gate spacer.

8. The semiconductor device of claim 7, further comprising a source/drain pattern that is on a fourth sidewall of the first gate electrode and is connected to the first channel pattern, the fourth sidewall of the first gate electrode being opposite to the first sidewall of the first gate electrode.

9. The semiconductor device of claim 1, wherein the substrate includes a first logic cell region on which the first channel pattern is and a second logic cell region on which the second channel pattern is, and
- wherein the first logic cell region and the second logic cell region are separated by the trench.

10. The semiconductor device of claim 1, wherein the substrate includes a first active pattern on which the first channel pattern is and a second active pattern on which the second channel pattern is,
- wherein the first and second active patterns extend in a first direction and are aligned with each other in the first direction, and
- wherein the first and second gate electrodes extend in a second direction intersecting the first direction.

* * * * *